US012804989B2

(12) United States Patent
Lichtenwalner et al.

(10) Patent No.: US 12,804,989 B2
(45) Date of Patent: Nov. 17, 2026

(54) SEMICONDUCTOR DEVICES INCLUDING AN OFFSET METAL TO POLYSILICON GATE CONTACT

(71) Applicant: Wolfspeed, Inc., Durham, NC (US)

(72) Inventors: Daniel Jenner Lichtenwalner, Raleigh, NC (US); Sei-Hyung Ryu, Cary, NC (US); Woongsun Kim, Cary, NC (US); Naeem Islam, Morrisville, NC (US)

(73) Assignee: WOLFSPEED, INC., Durham, NC (US)

( * ) Notice: Subject to any disclaimer, the term of this patent is extended or adjusted under 35 U.S.C. 154(b) by 54 days.

(21) Appl. No.: 17/096,147

(22) Filed: Nov. 12, 2020

(65) Prior Publication Data

US 2022/0149165 A1 May 12, 2022

(51) Int. Cl.
*H10D 64/27* (2025.01)
*H10D 30/66* (2025.01)
*H10D 64/66* (2025.01)

(52) U.S. Cl.
CPC ......... *H10D 64/513* (2025.01); *H10D 30/668* (2025.01); *H10D 64/665* (2025.01)

(58) Field of Classification Search
CPC ............. H01L 29/4236; H01L 29/7813; H01L 29/66734; H01L 29/4238; H01L 29/7811; H10D 64/519; H10D 30/665; H10D 30/668; H10D 62/393
See application file for complete search history.

(56) References Cited

U.S. PATENT DOCUMENTS

| | | | | |
|---|---|---|---|---|
| 6,642,600 | B2 | 11/2003 | Narazaki et al. | |
| 8,008,715 | B2 | 8/2011 | Kawaguchi et al. | |
| 8,222,108 | B2 | 7/2012 | Hsieh | |
| 2004/0173844 | A1 | 9/2004 | Williams et al. | |
| 2007/0114601 | A1 | 5/2007 | Lin et al. | |
| 2008/0079081 | A1 | 4/2008 | Hashimoto | |
| 2009/0085105 | A1 | 4/2009 | Su et al. | |
| 2010/0123220 | A1* | 5/2010 | Burke | H10D 30/668 257/E21.294 |
| 2011/0089486 | A1* | 4/2011 | Xu | H01L 29/66734 257/E21.409 |
| 2011/0233659 | A1* | 9/2011 | Tai | H10D 30/0297 438/270 |
| 2011/0291183 | A1* | 12/2011 | Lin | H10D 64/662 438/270 |
| 2013/0313576 | A1 | 11/2013 | Nakano | |
| 2014/0167145 | A1* | 6/2014 | Ichinoseki | H10D 64/519 257/329 |
| 2016/0093731 | A1 | 3/2016 | Meiser et al. | |
| 2016/0284838 | A1* | 9/2016 | Qin | H10D 62/106 |

(Continued)

FOREIGN PATENT DOCUMENTS

| | | |
|---|---|---|
| JP | 2020027858 A | 2/2020 |
| JP | 2022015781 A | 1/2022 |

*Primary Examiner* — Samuel A Gebremariam
*Assistant Examiner* — Jonas T Beardsley
(74) *Attorney, Agent, or Firm* — Myers Bigel, P.A.

(57) ABSTRACT

Power switching devices include a semiconductor layer structure, a unit cell transistor comprising a gate finger, the gate finger extending in a first direction in a gate trench that is below a surface of the semiconductor layer structure, and a gate bus, wherein a portion of the gate bus vertically overlaps the gate finger and is electrically connected to the gate finger.

29 Claims, 18 Drawing Sheets

(56) References Cited

U.S. PATENT DOCUMENTS

| | | | | |
|---|---|---|---|---|
| 2017/0033189 | A1 | 2/2017 | Werner et al. | |
| 2017/0194486 | A1* | 7/2017 | Venkatraman | H10D 62/393 |
| 2018/0350960 | A1* | 12/2018 | Naito | H10D 12/481 |
| 2020/0161460 | A1* | 5/2020 | Harada | H01L 29/1004 |
| 2021/0069926 | A1 | 3/2021 | Fuji et al. | |
| 2021/0367071 | A1* | 11/2021 | Shinoda | H01L 29/4236 |
| 2022/0013437 | A1 | 1/2022 | Nishi | |
| 2022/0149165 | A1 | 5/2022 | Lichtenwalner et al. | |
| 2023/0062475 | A1 | 3/2023 | Kumada | |
| 2024/0234570 | A1 | 7/2024 | Takahashi | |

* cited by examiner

SEMICONDUCTOR DEVICES INCLUDING AN OFFSET METAL TO POLYSILICON GATE CONTACT

FIELD

The present invention relates to semiconductor devices and, more particularly, to power semiconductor switching devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MISFET is typically separated from the channel region by a thin gate insulator. In most cases, the gate insulator is an oxide (e.g., a silicon oxide). A MISFET that has an oxide gate insulator is referred to as a Metal Oxide Semiconductor Field Effect Transistor ("MOSFET"). As oxide gate insulators are almost always used due to their superior properties, the discussion herein will focus on MOSFETs as opposed to MISFETs, but it will be appreciated that the techniques according to embodiments of the present invention that are described herein are equally applicable to devices having gate insulators formed with materials other than oxides.

Because the gate electrode of the MOSFET is insulated from the channel region by the gate insulator, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their "on" state and block large voltages (e.g., thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels and/or under high radiation densities.

A power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. However, as the applied voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable run-away generation of charge carriers within the semiconductor device, leading to a condition known as avalanche break-down.

A power semiconductor device may also begin to allow non-trivial amounts of leakage current to flow at a voltage level that is lower than the designed breakdown voltage of the device. In particular, leakage current may begin to flow at the edges of the active region, where high electric fields may occur due to electric field crowding effects. In order to reduce this electric field crowding (and the resulting increased leakage currents), the above-mentioned edge terminations may be provided that surround part or the entire active region of a power semiconductor device. These edge terminations may spread the electric field out over a greater area, thereby reducing the electric field crowding.

Vertical power semiconductor devices that include a MOSFET transistor can have a planar gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench and/or trenched gate MOSFETs. With the planar gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically utilize a more complicated manufacturing process

SUMMARY

Pursuant to some embodiments of the present invention, a semiconductor device includes a semiconductor layer structure, a unit cell transistor comprising a gate finger, the gate finger extending in a first direction in a gate trench that is below a surface of the semiconductor layer structure, and a gate bus. A portion of the gate bus vertically overlaps the gate finger and is electrically connected to the gate finger.

In some embodiments, the gate finger comprises a first material and the gate bus comprises a second material that is different from the first material.

In some embodiments, the second material of the gate bus comprises a layer of silicide, titanium (Ti), titanium nitride (TiN), tantalum (Ta), tantalum nitride (TaN), and/or tungsten (W)

In some embodiments, the portion of the gate bus is connected to the gate finger by a via extending between the gate finger and the portion of the gate bus.

In some embodiments, the semiconductor device further includes a dielectric layer on the gate finger, and the via extends through the dielectric layer between the gate finger and the portion of the gate bus.

In some embodiments, the portion of the gate bus is a first portion, the semiconductor device further comprises an active region and an inactive region, and the first portion of the gate bus extends in the first direction from a second portion of the gate bus in the inactive region to vertically overlap the gate finger in the active region.

In some embodiments, the portion of the gate bus is integrally connected to the gate bus.

In some embodiments, the gate finger extends on a gate insulating layer in the gate trench, and an uppermost surface of the gate finger is at or below an upper surface of the gate insulating layer.

In some embodiments, the portion of the gate bus is electrically connected to the gate finger at a position that is offset by a distance of between 0.2 and 10 μm from an end of the gate finger.

In some embodiments, the semiconductor device further includes a gate runner extending in a second direction that crosses the first direction, and the gate runner vertically overlaps the gate finger and is electrically connected to the gate finger.

In some embodiments, the gate finger is a plurality of gate fingers, each having a longitudinal axis extending in the first direction and spaced apart from one another in the second direction, and the gate runner vertically overlaps each of the plurality of gate fingers.

In some embodiments, the gate runner is electrically connected to at least two of the plurality of gate fingers by respective vias.

In some embodiments, the semiconductor device further includes a source contact on a first side of the semiconductor layer structure and a drain contact on a second side of the semiconductor layer structure that is opposite the semiconductor layer structure from the first side.

In some embodiments, the semiconductor layer structure comprises a substrate, and the substrate comprises a wide band-gap semiconductor.

In some embodiments, the substrate comprises silicon carbide.

In some embodiments, the portion of the gate bus vertically overlaps only an end portion of the gate finger.

In some embodiments, an upper surface of the gate finger is planar.

Pursuant to some embodiments of the present invention, a semiconductor device includes a semiconductor layer structure comprising an active region and an inactive region, a gate bus in the inactive region, and a gate finger that extends in a first direction in a gate trench that is below a surface of the semiconductor layer structure. the gate finger is electrically connected to the gate bus by a via that extends vertically in a direction that is perpendicular to an upper surface of the semiconductor layer structure.

In some embodiments, the semiconductor device further includes a dielectric layer on the gate finger, and the via extends through the dielectric layer.

In some embodiments, the via is connected to the gate finger at a position that is offset from an end of the gate finger.

In some embodiments, the semiconductor device further includes a gate connector extending in the first direction. The gate connector is electrically connected to the gate bus, and the gate connector is electrically connected to the gate finger by the via.

In some embodiments, the gate finger continuously extends from the active region of the semiconductor layer structure into the inactive region of the semiconductor layer structure.

In some embodiments, the gate finger comprises a first portion in the active region and a second portion in the inactive region, and a width of the first portion is smaller than a width of the second portion.

In some embodiments, the gate finger is electrically connected to a portion of the gate bus that extends in a second direction that crosses the first direction.

In some embodiments, the semiconductor device further includes a gate runner extending in the second direction, and the gate runner vertically overlaps the gate finger and is electrically connected to the gate finger.

In some embodiments, the gate finger is one of a plurality of gate fingers, each having a longitudinal axis extending in the first direction and spaced apart from one another in the second direction, and the gate runner vertically overlaps each of the plurality of gate fingers.

In some embodiments, the via by which the gate finger is electrically connected to the gate bus is a first via, and the gate runner is electrically connected to the gate finger by a second via.

In some embodiments, the gate finger extends on a gate insulating layer in the gate trench, and an uppermost surface of the gate finger is at or below an upper surface of the semiconductor layer structure.

In some embodiments, the uppermost surface of the gate finger is planar.

Pursuant to some embodiments of the present invention, a semiconductor device includes a semiconductor layer structure comprising an active region and an inactive region, a gate bus in the inactive region, at least a portion of the gate bus adjacent a periphery of the active region, a gate trench in the semiconductor layer structure, a gate insulating layer in the gate trench, and a gate finger on the gate insulating layer. The gate finger is electrically connected to the gate bus at a position on the gate finger that is at or below an upper surface of the semiconductor layer structure and/or an upper surface of the gate insulating layer.

In some embodiments, the gate finger comprises a first material, and the gate finger is electrically connected to the gate bus by a via that comprises a second material, different than the first material.

In some embodiments, the position on the gate finger that is at or below the upper surface of the semiconductor layer structure and/or the upper surface of the gate insulating layer comprises an interface between the first material and the second material.

In some embodiments, the semiconductor device further includes a dielectric layer on the gate finger, and the via extends through the dielectric layer.

In some embodiments, the first material comprises polysilicon and/or silicide.

In some embodiments, the second material comprises titanium (Ti), titanium nitride (TiN), tantalum (Ta), tantalum nitride (TaN), and/or tungsten (W).

In some embodiments, the semiconductor device further includes a gate connector extending from the inactive region to the active region. The gate connector is electrically connected to the gate bus, and the gate connector is electrically connected to the gate finger by the via.

In some embodiments, the gate finger is electrically connected to the gate bus at the position that is offset from an end of the gate finger.

In some embodiments, the gate finger continuously extends from the active region of the semiconductor layer structure into the inactive region of the semiconductor layer structure.

In some embodiments, the gate finger comprises a first portion in the active region and a second portion in the inactive region, and a width of the first portion is smaller than a width of the second portion.

In some embodiments, the semiconductor device further includes a gate runner extending on the semiconductor layer structure, and the gate runner vertically overlaps the gate finger and is electrically connected to the gate finger.

In some embodiments, the gate finger is a plurality of gate fingers, each having a longitudinal axis extending in a first direction and spaced apart from one another in a second direction that crosses the first direction, and the gate runner has a longitudinal axis that extends in the second direction and vertically overlaps each of the plurality of gate fingers.

In some embodiments, the semiconductor device further includes a source contact on a first side of the semiconductor layer structure and a drain contact on a second side of the semiconductor layer structure that is opposite the semiconductor layer structure from the first side.

In some embodiments, the semiconductor layer structure comprises a substrate, and the substrate comprises a wide band-gap semiconductor.

In some embodiments, an upper surface of the gate finger is planar.

Pursuant to some embodiments of the present invention, a semiconductor includes a semiconductor layer structure and a unit cell transistor comprising a gate finger, the gate finger extending in a first direction in a gate trench that is below a surface of the semiconductor layer structure, wherein an upper surface of the gate finger is substantially planar.

In some embodiments, the semiconductor device further includes a gate bus electrically connected to the gate finger. The semiconductor layer structure comprises and active region and an inactive region, and a portion of the gate bus is in the inactive region.

In some embodiments, the portion of the gate bus is connected to the gate finger by a via extending between the gate finger and the portion of the gate bus.

In some embodiments, the gate finger continuously extends from the active region of the semiconductor layer structure into the inactive region of the semiconductor layer structure.

In some embodiments, the portion of the gate bus is a first portion, a second portion of the gate bus is in the active region, and the second portion of the gate bus is connected to the gate finger by a via extending between the gate finger and the second portion of the gate bus.

In some embodiments, the gate finger extends on a gate insulating layer in the gate trench, and an uppermost surface of the gate finger is at or below an upper surface of the gate insulating layer.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 1A:
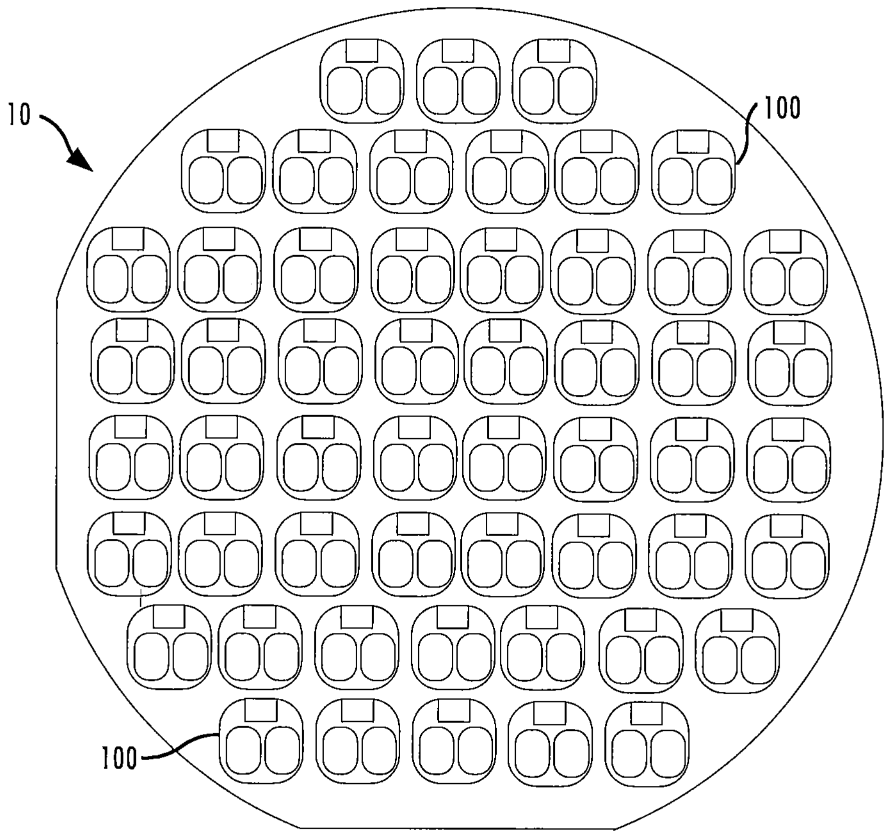
FIG. 1A is a schematic plan view of a semiconductor wafer that includes a plurality of trenched gate power switching devices according to embodiments of the present invention.

In the following detailed description, numerous specific details are set forth to provide a thorough understanding of embodiments of the present disclosure. However, it will be understood by those skilled in the art that the present disclosure may be practiced without these specific details. In some instances, well-known methods, procedures, components, and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Embodiments described herein provide devices, and methods for manufacturing such devices, that improve the performance of a gate trench semiconductor device. Embodiments described herein may provide an improved gate trench structure that incorporates vias coupled to a gate finger, including the use of a gate connector that couples to the gate finger at a position that is offset from the edge of the gate finger.

Power silicon carbide MISFETs are in use today for applications requiring high voltage blocking such as voltage blocking of 5,000 volts or more. The discussion herein will focus on MOSFETs as opposed to MISFETs, but it will be appreciated that the techniques according to embodiments of the present invention that are described herein are equally applicable to devices having gate insulators formed with materials other than oxides. By way of example, silicon carbide MOSFETs are commercially available that are rated for current densities of 10 A/cm$^2$ or more that will block voltages of at least 10 kV. To form such devices, a plurality of “unit cell” structures are typically formed, where each unit cell structure includes a MOSFET transistor. In high power applications, a large number of these unit cells (e.g., hundreds or thousands) are typically provided on a single semiconductor substrate, and a gate electrode is formed on a top side of the semiconductor substrate that acts as the gate electrode for all of the unit cells. The opposite (bottom) side of the semiconductor substrate acts as a common drain for all of the units cells of the device. A plurality of source contacts are formed on source regions in the semiconductor layer structure. In some embodiments, the source regions may be exposed within openings in the gate electrode. These source contacts are also electrically connected to each other to serve as a common source. The resulting device has three terminals, namely a common source terminal, a common drain terminal, and a common gate electrode that act as the terminals for the hundreds or thousands of individual unit cell transistors. It will be appreciated that the above description is of an n-type MOSFET; the locations of the drain and source, as well as the conductivity types of the various layers/regions, would be reversed for a p-type MOSFET.

The gate electrode of a power MOSFET may be implemented by forming a patterned conductive layer that includes a plurality of elongated gate fingers that extend through an active region of the device. The patterned conductive layer may comprise a semiconductor layer such as, for example, a polysilicon layer and/or doped silicon (Si). The patterned conductive layer may also include a gate pad in an inactive region of the device, and each gate finger may connect to the gate pad, either directly or by one or more gate buses.

The present disclosure describes an approach to improve the reliability of a power MISFET and/or IGBT (e.g., gate controlled devices). The embodiments described herein may be helpful for reducing and/or preventing premature failure of the gate-controlled device by removing a condition of the device structure that can lead to premature failure of the device.

The approaches described herein may provide devices having an improved connection to the gate finger from the gate bus. In some embodiments, the improved connection may be accomplished by a vertical via that is offset from an end of the gate finger. Materials of the gate finger may include, but are not limited to, polycrystalline silicon (Si) (also referred to herein as “polysilicon” or “poly”). Embodiments described herein may help to improve the performance of the device by improving the distribution of a gate signal to the gate finger of the device in a way that avoids an electrical field concentration that can lead to premature failure of a gate oxide that is adjacent the gate finger.

FIG. 1A is a schematic plan view of a wafer 10 that includes a plurality of trenched gate power switching devices 100 according to embodiments of the present invention. Referring to FIG. 1A, the wafer 10 may be a thin planar structure that includes a semiconductor layer structure with other material layers such as insulating layers and/or metal layers formed thereon. The semiconductor layer structure may include a semiconductor substrate and/or a plurality of other semiconductor layers. A plurality of power switching devices 100 may be formed using the wafer 10. The switching devices 100 may be formed, for example, in rows and columns and may be spaced apart from each other so that the wafer 10 may later be singulated (e.g., diced) to separate the individual switching devices 100 for packaging and testing. The wafer 10 may comprise a silicon carbide substrate having one or more silicon carbide layers formed thereon (e.g., by epitaxial growth) in some embodiments. Other semiconductor layers (e.g., polysilicon layers), insulating layers, and/or metal layers may be formed on the silicon carbide semiconductor layer structure to form the power switching devices 100. The silicon carbide substrate and the silicon carbide layers formed thereon may be 4H silicon carbide in some embodiments, though the present disclosure is not limited thereto. The number and arrangement of power switching devices 100 illustrated in FIG. 1A are merely an example in which the sizes of the power switching devices 100 have been exaggerated for ease of description.

Figure 1B:
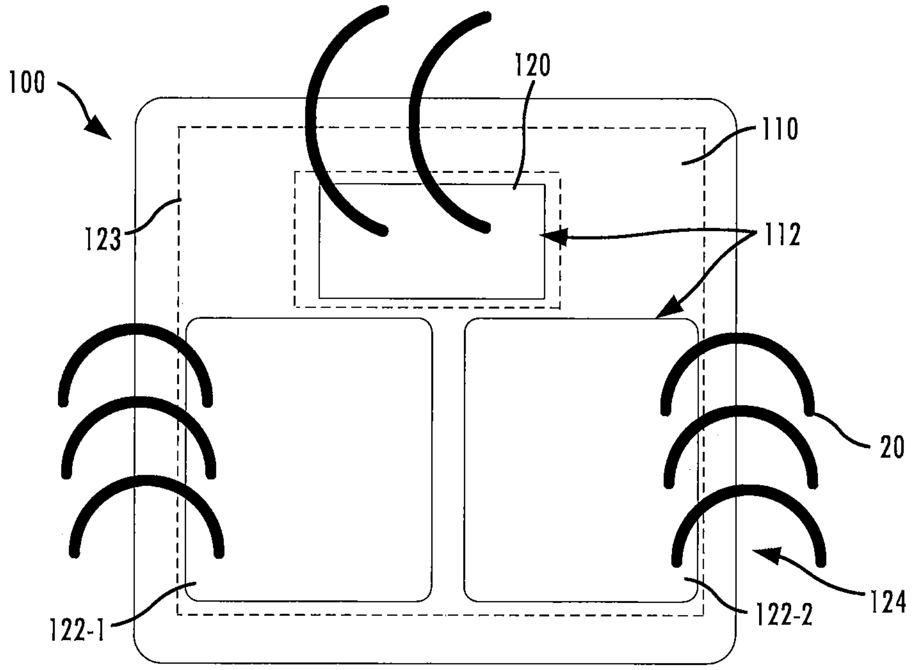
FIG. 1B is a schematic plan view of a trenched gate power switching device that may be included on the semiconductor wafer of FIG. 1A.
Figure 1C:
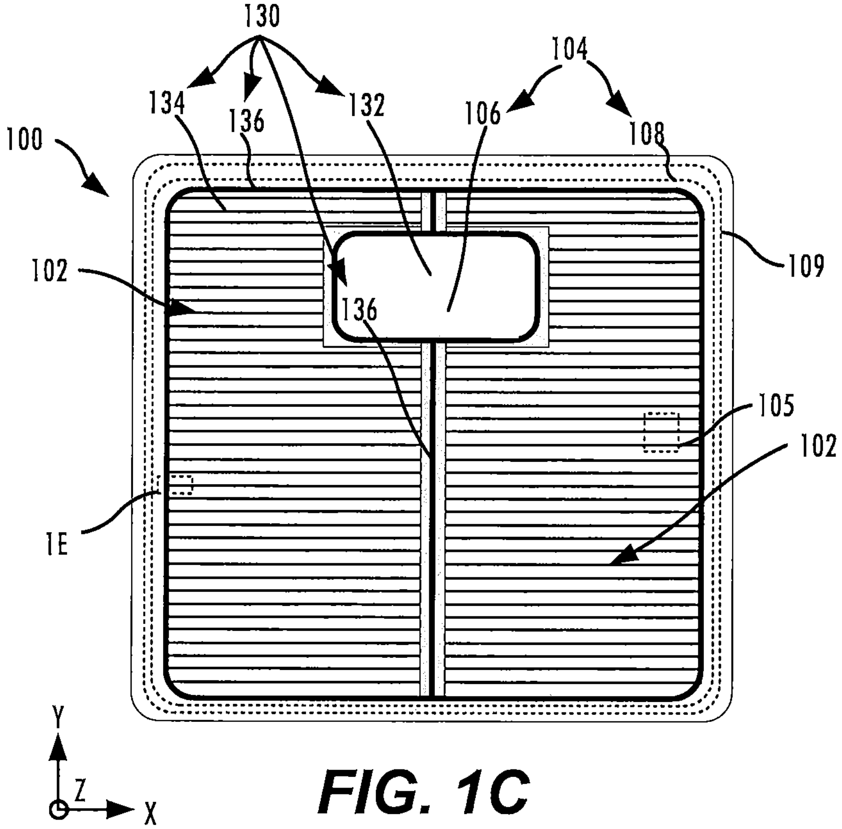
FIG. 1C is a schematic plan view of an example of the trenched gate power switching device of FIG. 1B with the source metallization removed.
Figure 1D:
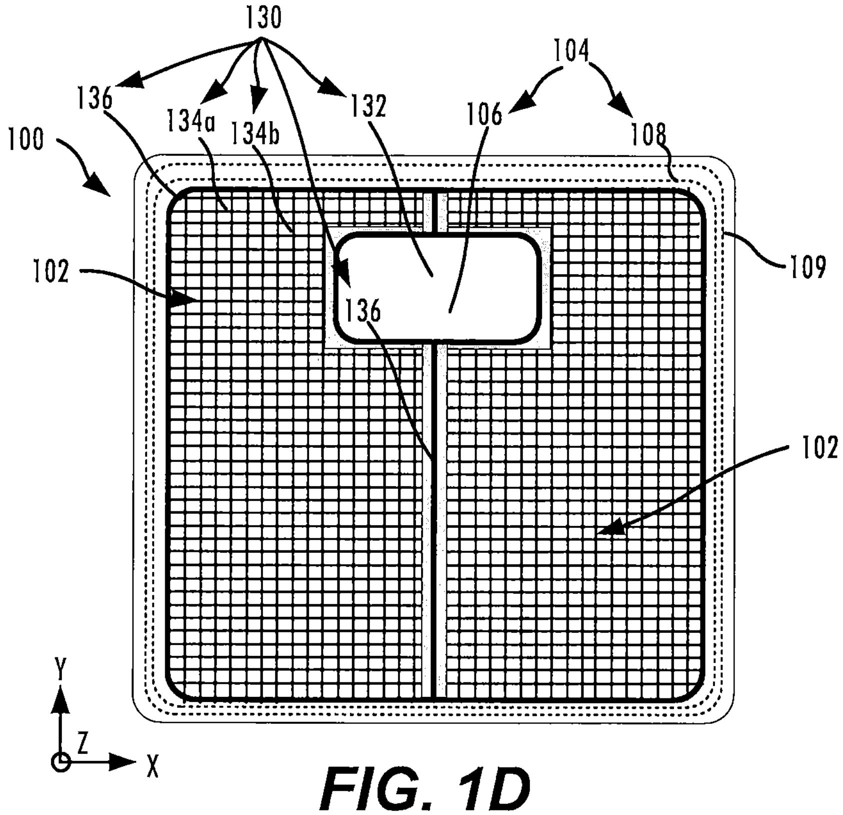
FIG. 1D is a schematic plan view of an additional example of the trenched gate power switching device of FIG. 1B.

FIG. 1B is a schematic plan view a trenched gate power switching device 100 that may be included on the semiconductor wafer 10 of FIG. 1A. FIGS. 1C and 1D are schematic plan views of examples of the power switching device 100 of FIG. 1B with the source and gate metallization removed. In the description below it is assumed that the power switching device 100 is an n-type power MOSFET 100, but the present invention is not limited thereto. The embodiments described herein may be equally applied to p-type devices.

As shown in FIG. 1B, a protective layer 110 covers a substantial portion of the top surface of the power MOSFET 100. The protective layer 110 may be formed, for example, of polyamide and/or a dielectric. Various bond pads may be exposed through openings 112 in the protective layer 110. The bond pads may include a gate bond pad 120 and one or more source bond pads 122. The configuration, shape, and structure of the gate bond pad 120 and source bond pads 122 illustrated in FIG. 1B are merely examples, and the embodiments described herein are not limited thereto. Two source bond pads 122-1, 122-2 are illustrated in FIG. 1B. While not visible in FIG. 1B, a drain contact and/or bond pad 124 may be provided on the bottom side of the MOSFET 100. The bond pads 120, 122, 124 may be formed of a metal, such as aluminum, that bond wires can be readily attached to via techniques such as thermo-compression or soldering. Source contacts may be provided that contact a semiconductor layer structure of the MOSFET 100. The source contacts may be lower portions of a source metal layer 123 that extends across much of the upper surface of the MOSFET 100 (e.g., all but the portion of the upper surface of the MOSFET 100 occupied by the gate bond pad 120). The source bond pads 122-1, 122-2 may comprise portions of the source metal layer 123 that are exposed by the openings 112 in the protective layer 110. Bond wires 20 are shown in FIG. 1B that may be used to connect the gate bond pad 120 and the source bond pads 122-1, 122-2 to external elements (not shown) such as terminals of other circuits.

As is shown in FIG. 1C, the MOSFET 100 includes a semiconductor layer structure that includes an active region 102 and an inactive region 104. The active region 102 is an area of the device that includes operable transistors (e.g., the unit cell transistors discussed herein), while the inactive region 104 is an area that does not include such operable transistors. The unit cell transistors of the MOSFET 100 are formed in the active region 102. The location of a plurality of unit cells are shown by a box 105 in FIG. 1C to provide context.

The active region 102 may generally correspond to the area under the source metal layer 123 in some embodiments. The inactive region 104 includes a gate pad portion 106 and a termination portion 108. The gate pad portion 106 of the inactive region 104 may approximately correspond to the portion of the semiconductor layer structure that is underneath the gate bond pad 120. The termination portion 108 of the inactive region 104 may extend around a periphery of the MOSFET 100 and may include one or more termination structures such as guard rings and/or a junction termination extension that can reduce electric field crowding that may occur around the edge of the device. The termination structures (shown as guard rings 109) may spread out the electric fields along the periphery of the MOSFET 100, reducing electric field crowding. The edge termination structures may serve to increase the reverse blocking voltage at which a phenomenon known as “avalanche breakdown” occurs where an increasing electric field result in runaway generation of charge carriers within the semiconductor device, resulting in a sharp increase in current that may damage or even destroy the device. Though guard rings 109 are illustrated in FIGS. 1C and 1D, it will be understood that these are merely examples, and that other termination structures may be used (e.g., a junction termination extension) or, in some embodiments, omitted.

As is further shown in FIG. 1C, a gate electrode structure 130 may be provided that includes a gate pad 132, a plurality of gate fingers 134, and one or more gate buses 136 that electrically connect the gate fingers 134 to the gate pad 132. The gate pad 132 of the gate electrode structure 130 may be underneath the gate bond pad 120 in the gate pad portion 106 of the inactive region 104, and the gate fingers 134 may extend (e.g., horizontally) across the active region 102. An insulating layer (not shown) may cover the gate fingers 134 and gate bus(es) 136. The source metal layer 123 may be provided over the gate fingers 134 and insulating layer, with the source contacts of the source metal layer contacting corresponding source regions in the semiconductor layer structure in openings between the gate fingers 134.

The gate buses 136 may extend in the inactive region 104 of the power switching device 100 and convey a gate signal to the gate fingers 134. For example, in some embodiments, a gate bus 136 may extend in the inactive region 104 around a circumference of the active region 102. In some embodiments, a gate bus 136 may extend through a central portion of the power switching device 100 and may divide the active region 102 into two portions. In general, the material utilized in the gate bus 136 (which may be or contain, e.g., metal) may have a lower resistivity than that used in the gate fingers 134 (which may be or contain, e.g., polysilicon or silicide).

Referring to FIG. 1C, the gate fingers 134 may distribute a gate signal of the power switching device 100 throughout the active region 102. In some embodiments, gate fingers and/or stripes 134 of a gate electrode may extend (e.g., have a longitudinal axis that extends) in a common direction (e.g., the X direction in FIG. 1C). In some embodiments, the gate fingers 134 may include a conductive material (e.g., poly Si or a silicide). In some embodiments, the gate fingers 134 may be connected to a gate bus 136 at the periphery of the active region 102 (e.g., at an end of the gate finger 134). Thus, a gate signal applied to the power switching device 100 may be communicated from the gate bond pad 120 to the gate pad 132, to the gate bus 136, and then to the gate finger 134. In some embodiments, the connection between the gate finger 134 and the gate bus 136 may occur only at the opposite ends of the gate finger 134.

The gate fingers 134 may be implemented in a trench configuration, in which a portion of the gate finger 134 extends below an upper surface of a semiconductor layer structure, and/or as a planar configuration, in which the gate finger 134 extends on an upper surface of the semiconductor layer structure.

One method that may be used to reduce the gate resistance of the device is to increase the number of gate fingers using a grid layout. FIG. 1D illustrates an alternative example of the trenched gate power switching device 100 of FIG. 1B that incorporates such a grid layout. As illustrated in FIG. 1D, the gate electrode structure 130 may include first gate fingers 134*a* extending in a first direction (e.g., the X direction of FIG. 1D) and second gate fingers 134*b* extending in a second direction (e.g., the Y direction of FIG. 1D). The first and second gate fingers 134*a*, 134*b* may interconnect in a grid layout. By using a grid layout, an overall resistance of the gate region may be lowered. The gate grid may trade off a lower resistance for the gate connection with taking up space on the device for what would have been electrical ohmic contact to the source.

Figure 1E:
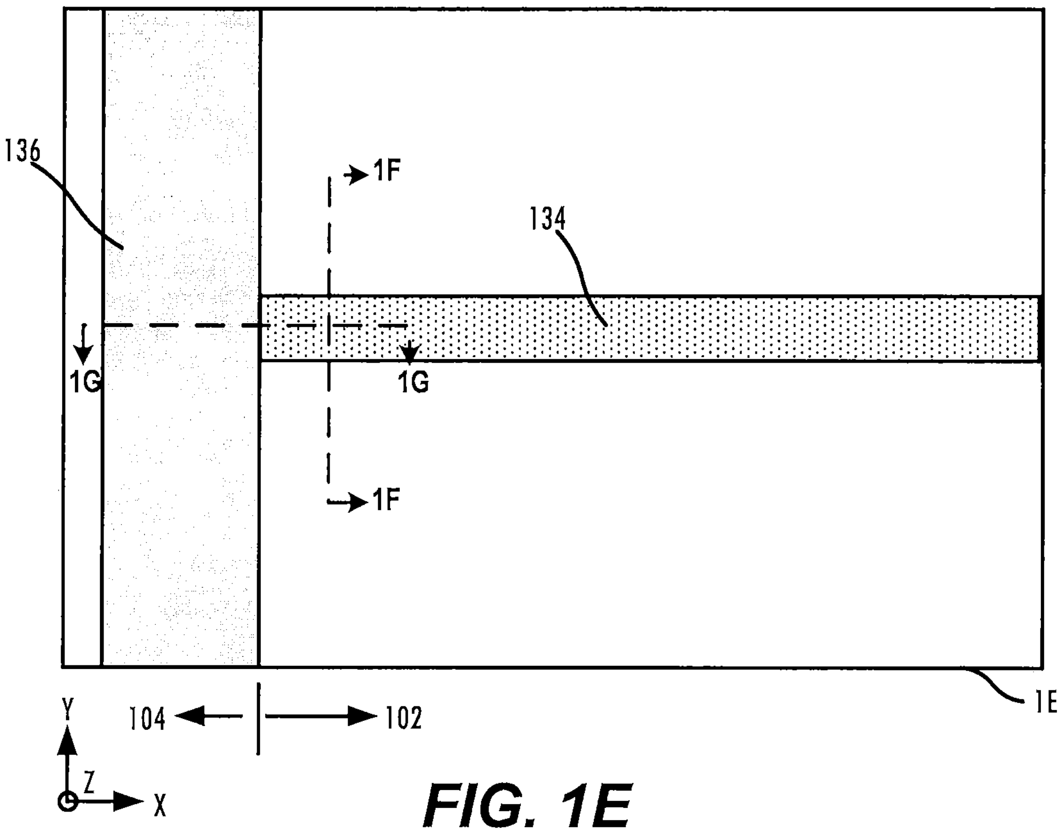
FIG. 1E is a schematic plan view of portion 1E of FIG. 1C.
Figure 1F:
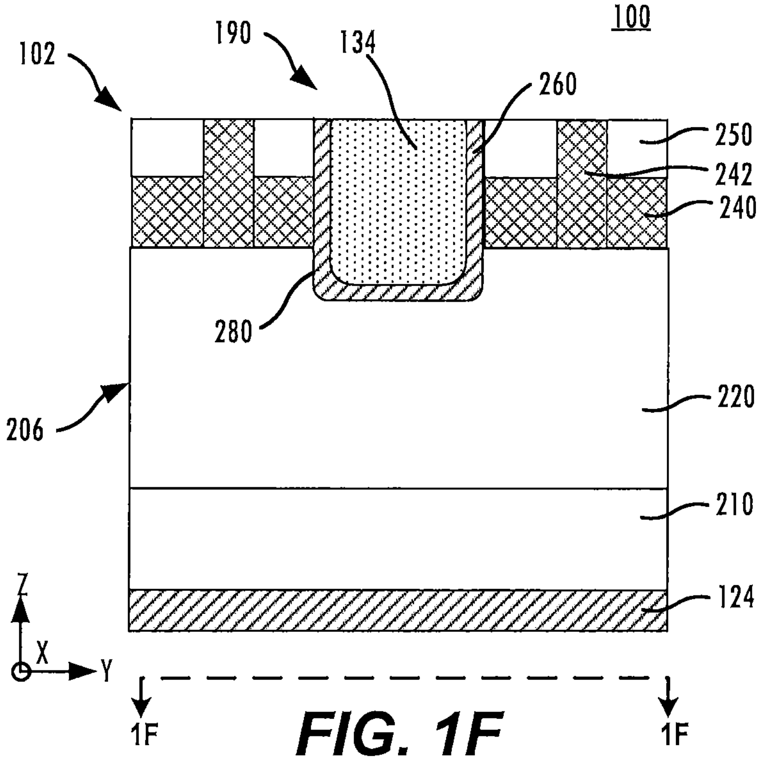
FIG. 1F is a schematic cross-sectional diagram taken along the line 1F-1F of FIG. 1E that illustrates the unit cell structure in an active region of the trenched gate power switching device.
Figure 1G:
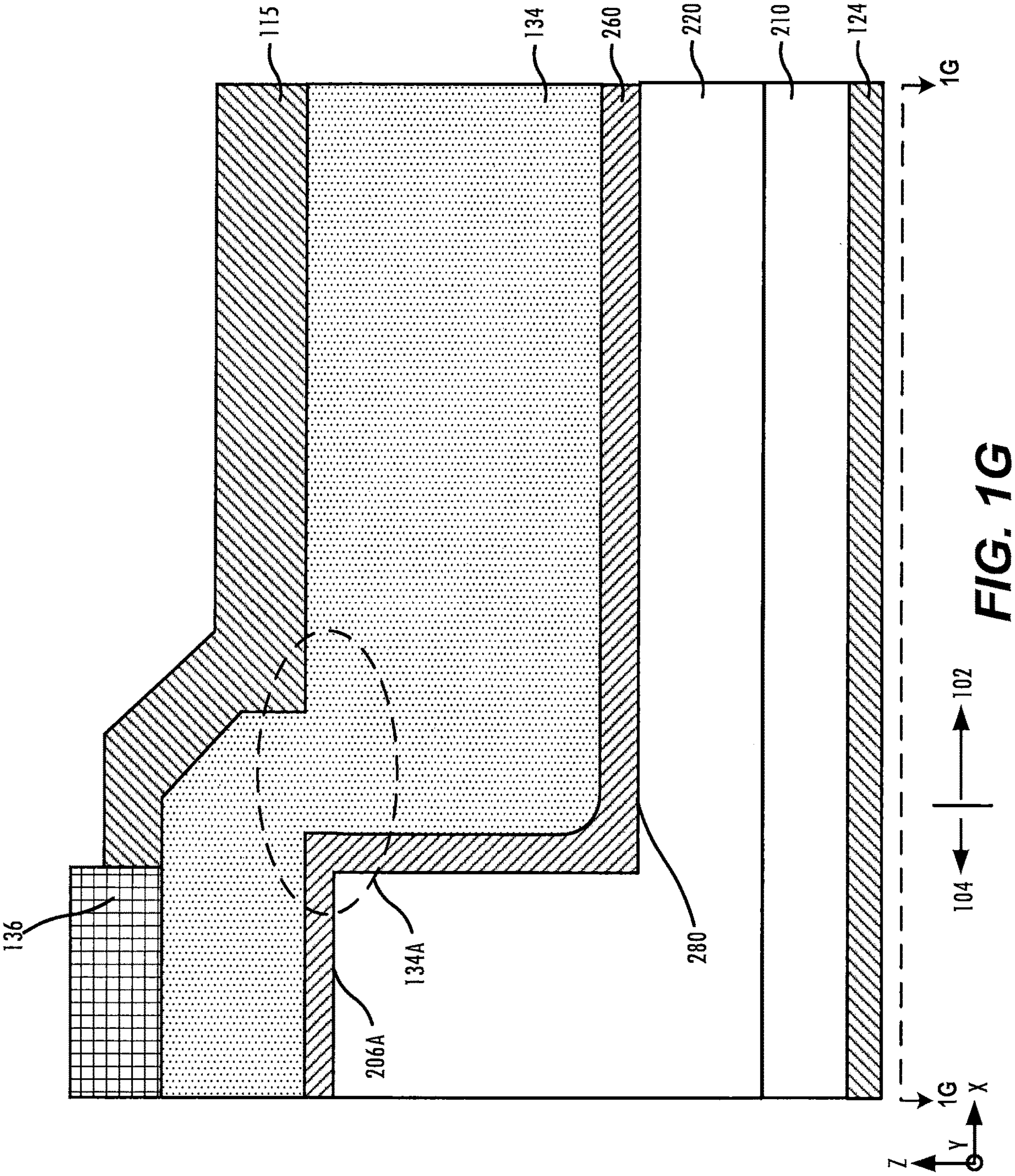
FIG. 1G is a schematic cross-sectional diagram taken along the line 1G-1G of FIG. 1E that illustrates a transition between the gate bus and the gate finger of the trenched gate power switching device.

FIG. 1E is a schematic plan view of portion 1E of FIG. 1C. FIG. 1E highlights the connection of a gate bus 136 to a gate finger 134. FIG. 1F is a schematic cross-sectional diagram taken along the line 1F-1F of FIG. 1E that illustrates the unit cell structure in an active region 102 of the trenched gate power switching device 100. FIG. 1G is a schematic cross-sectional diagram taken along the line 1G-1G of FIG. 1E that illustrates a transition between the gate bus 136 and the gate finger 134 of the trenched gate power switching device 100.

Referring to FIGS. 1E and 1F, the MOSFET device 100 may include a unit cell 190 that is part of the active region 102 of MOSFET 100. The unit cell 190 may be one of a plurality of unit cells 190 that are electrically disposed in parallel.

The power MOSFET 100, and hence the unit cell 190, may include an n-type wide band-gap semiconductor substrate 210. The substrate 210 may comprise, for example, a single crystal 4H silicon carbide semiconductor substrate. The substrate 210 may be heavily-doped with n-type impurities (i.e., an $n^+$ silicon carbide substrate). The impurities may comprise, for example, nitrogen or phosphorous. The doping concentration of the substrate 210 may be, for example, between $1\times10^{18}$ atoms/$cm^3$ and $1\times10^{21}$ atoms/$cm^3$, although other doping concentrations may be used. The substrate 210 may be any appropriate thickness (e.g., between 100 and 500 microns thick).

A lightly-doped n-type ($n^-$) silicon carbide drift region 220 may be provided on the substrate 210. The n-type silicon carbide drift region 220 may be formed by, for example, epitaxial growth on the silicon carbide substrate 210. The n-type silicon carbide drift region 220 may have, for example, a doping concentration of $1\times10^{14}$ to $5\times10^{17}$ dopants/$cm^3$. The n-type silicon carbide drift region 220 may be a thick region, having a vertical height above the substrate 210 of, for example, 3-200 microns. An upper portion of the n-type silicon carbide drift region 220 may comprise an n-type silicon carbide current spreading layer in some embodiments that is more heavily doped than the lower portion of the n-type silicon carbide drift region 220.

An upper portion of the n-type silicon carbide drift region 220 may be doped p-type to form p-wells 240. The p-wells 240 may have a doping concentration of, for example, between $5\times10^{16}/cm^3$ and $5\times10^{19}/cm^3$. In some embodiments, an upper portion 242 of each p-well 240 may be more heavily doped with p-type dopants, however, the present disclosure is not limited thereto. The upper portion 242 of each p-well 240 may have a doping concentration of, for example, between $2\times10^{18}/cm^3$ and $5\times10^{20}/cm^3$. In some embodiments, the heavily-doped portion 242 of the p-well 240 may be omitted (i.e., that portion of the p-well 240 may have the same or similar doping concentration as the rest of the p-well 240). The p-wells 240 (including the more heavily-doped upper portions 242 thereof, when present) may be formed by ion implantation. As is known to those skilled in the art, ions such as n-type or p-type dopants may be implanted in a semiconductor layer or region by ionizing the desired ion species and accelerating the ions at a predetermined kinetic energy as an ion beam towards the surface of a semiconductor layer in an ion implantation target chamber. Based on the predetermined kinetic energy, the desired ion species may penetrate into the semiconductor layer to a certain depth.

In the active region 102, heavily-doped ($n^+$) n-type silicon carbide source regions 250 may be formed in upper portions of the p-wells 240 directly adjacent and contacting the more heavily doped portions 242 of the p-wells 240. The n-type source regions 250 may also be formed by ion implantation. The heavily-doped ($n^+$) n-type silicon carbide regions 250 act as source regions for the unit cell transistor 190. The drift region 220 and the substrate 210 together act as a common drain region for the unit cell transistor 190.

The n-type silicon carbide substrate 210, n-type silicon carbide drift region 220, the p-wells 240, 242 and the n-type source regions 250 formed therein may together comprise a semiconductor layer structure 206 of the MOSFET device 100.

A gate insulating layer 260 may be formed within a gate trench 280 in the upper surface of the semiconductor layer structure 206 between the p-wells 240 and n-type source regions 250. The gate insulating layer 260 may comprise, for example, a silicon oxide layer, although other insulating materials may be used. A gate finger 134 is formed on the gate insulating layer 260 and may fill the trench 280. It will be appreciated that the gate finger 134 may be part of the continuous gate electrode layer 130 (see FIGS. 1C and 1D) that includes the gate pad 132, the plurality of gate fingers 134, and the one or more gate buses 136. In some embodiments, this gate finger 134 may comprise, for example, a semiconductor layer (e.g., polysilicon) and/or a metal gate layer.

Source contacts (not shown) may be formed on the n-type source regions 250 and the more heavily-doped portions 242 of the p-wells. The heavily-doped portions 242 of the p-wells may be as shown, or may extend deeper than the trench depth as needed for blocking purposes. As described above with reference to FIGS. 1A-1B, the source contacts may be part of a continuous source metal layer 123 that extends across the upper surface of the silicon carbide semiconductor layer structure 206. The source contacts and the remainder of the source metal layer 123 (as well as the insulating layer that electrically isolates the gate fingers 134 from the source metal layer 123) is not shown in FIG. 1F to simplify the drawing. The source contacts may comprise, for example, metals such as nickel, titanium, tungsten or aluminum, or alloys or thin layered stacks of these or similar materials. As described above, a drain contact 124 may be formed on the lower surface of the substrate 210. The drain contact 124 may comprise, for example, similar materials to the source contact, as this forms an ohmic contact to the silicon carbide substrate 210. Current may flow from the n-type source regions 250 through the drift region 220 that is underneath the gate finger 134 when a voltage is applied to the gate finger 134.

While the MOSFET 100 is illustrated as an n-type device with the source contacts on an upper surface thereof and the drain contact 124 on the bottom surface thereof, it will be appreciated that in p-type devices these locations are reversed. Accordingly, in portions of the descriptions below (including the claims) the source contacts and drain contacts may generically refer to either a source contact or a drain contact.

Referring to FIGS. 1E and 1G, the gate finger 134 may contain a conductive material, such as polysilicon, within the gate trench 280. The gate finger 134 may be on the gate insulating layer 260 that is also within the gate trench 280. The conductive material of the gate finger 134 in the gate trench 280 is coupled to a portion of a gate bus 136 that is further connected to the gate pad 132 (see FIGS. 1C and 1D). A dielectric layer 115 may cover the gate finger 134 in the active region 102. The gate bus 136 may couple to the conductive material of the gate finger 134 in the inactive region 104 that is outside the active region 102.

As shown in FIG. 1G, the gate bus 136 may extend in the inactive region 104 on an upper surface 206A of the semiconductor layer structure 206. The gate insulating layer 260 may continuously extend from within the gate trench 280 in the active region 102 to the upper surface 206A of the semiconductor layer structure 206 in the inactive region 104. Similarly, the gate finger 134 may continuously extend from within the gate trench 280 in the active region 102 to the upper surface 206A of the semiconductor layer structure 206 in the inactive region 104. As a result, a portion 134A of the conductive material of the gate finger 134 may be disposed at a first level on the upper surface 206A of the semiconductor layer structure 206 and extend into the gate trench 280 at a second level that is lower (e.g., closer to the substrate 210) than the first level.

The deposition of the conductive material of the gate finger 134 both within the gate trench 280 and on the upper surface 206A of the semiconductor layer structure 206 creates the portion 134A of the conductive material at the corner of the surface (shown in the ellipse in FIG. 1G). The corner of the conductive material may act as an electric field concentrator during operation of the device. Due to the higher electric field that may be present at the portion 134A of the gate finger 134, the gate insulating layer 260 that is adjacent the portion 134A of the gate finger 134 may be prone to premature breakdown.

The present disclosure proposes connections from the gate bus 136 to the gate finger 134 using a via (e.g., a vertical metal via) that is offset from this corner of the gate trench 280. A portion of the gate bus 136, also described as a "gate connector" herein, may be extended and/or formed over the conductive material of the gate finger 134. The via will extend vertically from the gate connector to the gate finger 134. This via may be provided either inside the active region (e.g., using a gate connector to extend to the gate finger 134 in the active region 102) or outside the active region 104 (e.g., extending the gate finger 134 into the inactive region). As a result of this improvement, a level of the conductive material of the gate finger 134 within the gate trench 280 may remain below the top surface of the gate trench 280.

Figure 2A:
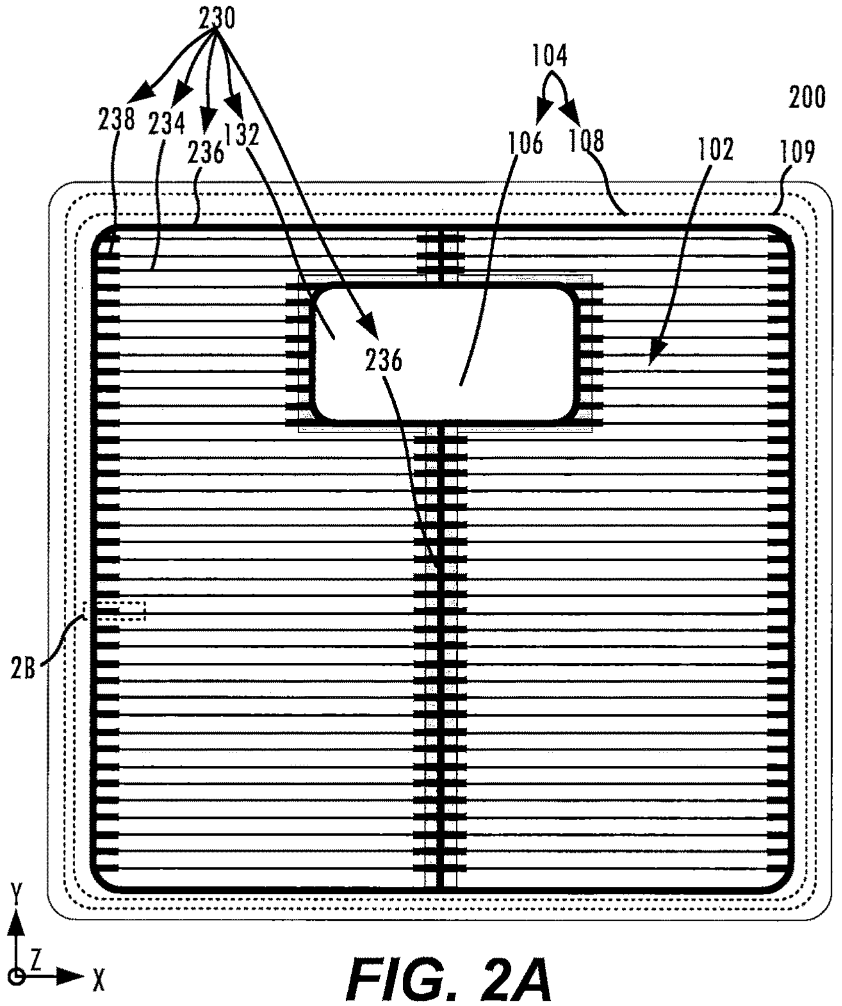
FIG. 2A is a schematic plan view of an example of a power switching device according to some embodiments of the present disclosure with the source and gate metallization removed.
Figure 2B:
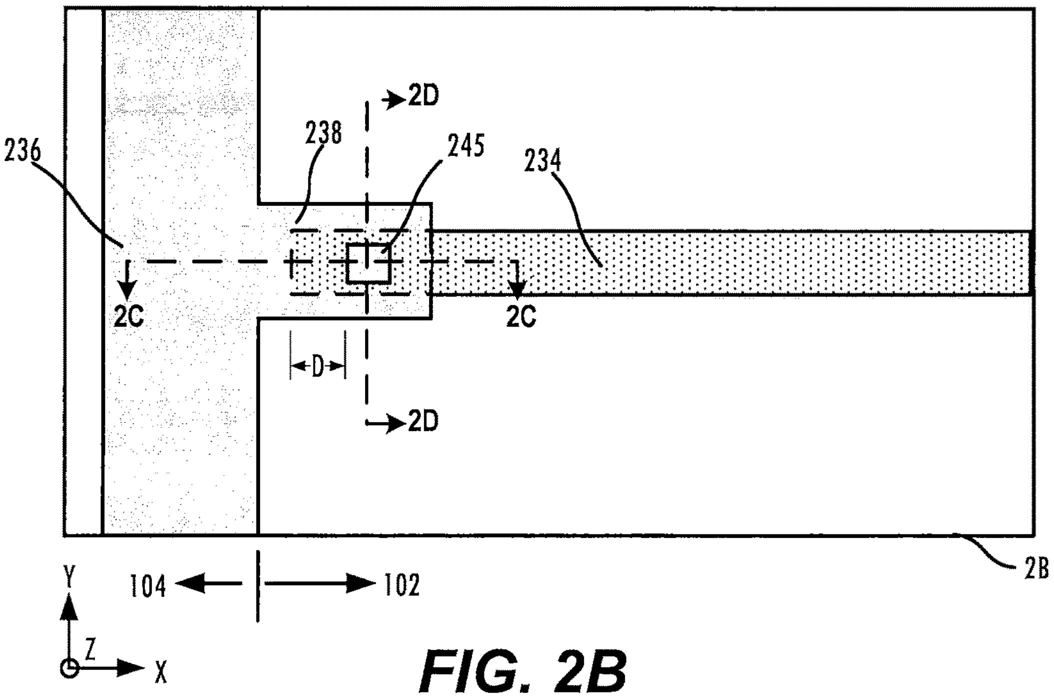
FIG. 2B is a schematic plan view of portion 2B of FIG. 2A.
Figure 2C:
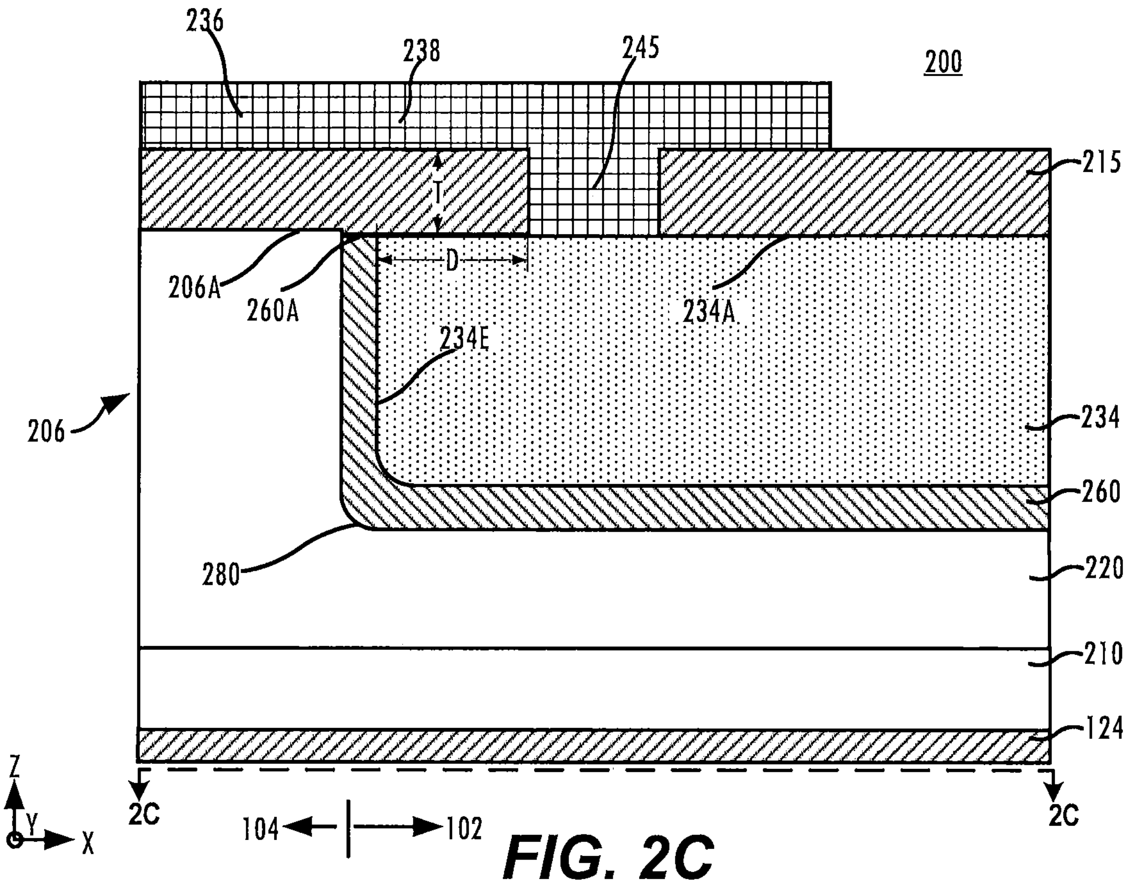
FIG. 2C is a schematic cross-sectional view taken along the line 2C-2C of FIG. 2B.
Figure 2D:
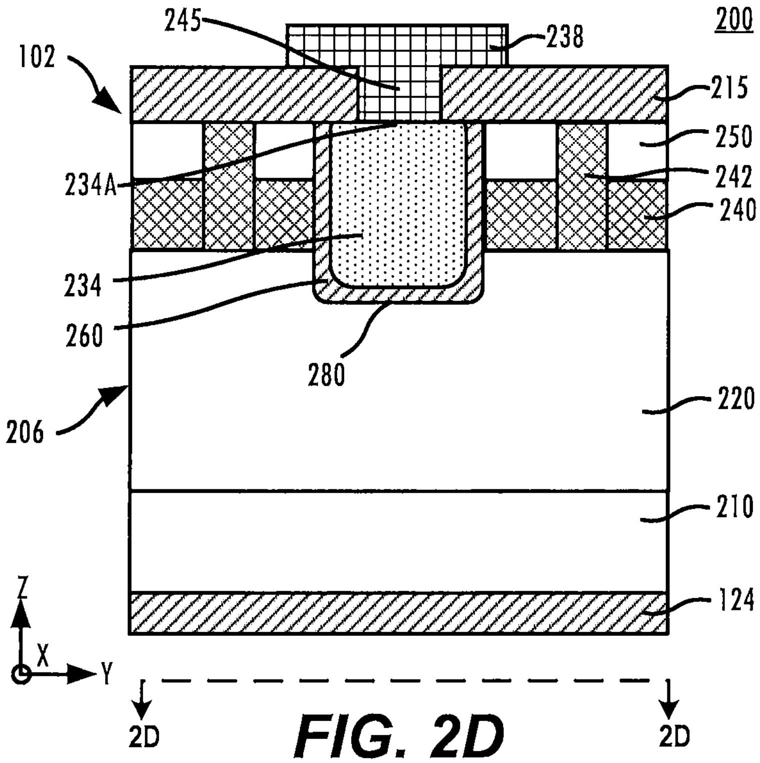
FIG. 2D is a schematic cross-sectional view taken along the line 2D-2D of FIG. 2B.

FIG. 2A is a schematic plan view of an example of a power switching device 200 according to some embodiments of the present disclosure with the source and gate metallization removed. FIG. 2A represents a view of the device that is similar to that illustrated in FIG. 1C. As a result, a description of portions of FIG. 2A that are similar to those of FIG. 1C will be omitted for brevity. FIG. 2B is a schematic plan view of portion 2B of FIG. 2A. FIG. 2C is a schematic cross-sectional view taken along the line 2C-2C of FIG. 2B. FIG. 2D is a schematic cross-sectional view taken along the line 2D-2D of FIG. 2B.

As is shown in FIG. 2A, the power switching device 200 includes a semiconductor layer structure that includes an active region 102 and an inactive region 104.

The active region 102 includes a plurality of unit cell transistors coupled in parallel. The inactive region 104 includes a gate pad portion 106 and a termination portion 108. The termination portion 108 may include termination structures (shown as guard rings 109).

As is further shown in FIG. 2A, a gate electrode structure 230 may be provided that includes a gate pad 132, a plurality of gate fingers 234, one or more gate buses 236 that electrically connect the gate fingers 234 to the gate pad 132, and one or more gate connectors 238.

The gate buses 236 may extend in the inactive region 104 of the power switching device 200 and convey a gate signal to the gate fingers 234. For example, in some embodiments, a gate bus 236 may extend in the inactive region 104 around a circumference of the active region 102. In some embodiments, the gate bus 236 may be composed of metal silicides, and/or may include metals such as titanium (Ti), titanium nitride (TiN), tantalum (Ta), tantalum nitride (TaN), and/or tungsten (W). In general, the material utilized in the gate bus 236 (which may be or contain, e.g., metal) may have a lower resistivity than that used in the gate fingers 234 (which may be or contain, e.g., polysilicon or silicide).

The gate fingers 234 may distribute a gate signal of the power switching device 200 throughout the active region 102. In some embodiments, gate fingers and/or stripes 234 of a gate electrode may have a longitudinal axis that extends in a common direction (e.g., the X direction in FIG. 2A). In some embodiments, the gate fingers 234 may include a conductive material (e.g., poly Si or a silicide). In some embodiments, the gate fingers 234 may be connected to a gate bus 236 that is in the inactive region 104 at the periphery of the active region 102. Thus, a gate signal applied to the power switching device 200 may be communicated from the gate pad 132, to the gate bus 236 in the inactive region 104, and then to the gate finger 234 within the active region 102. The gate fingers 234 may be implanted as a trench configuration, in which a portion of the gate finger 234 extends below an upper surface of the semiconductor layer structure.

Unlike prior devices, the power switching device 200 may connect the gate bus 236 in the inactive region 104 to the gate finger 234 in the active region 102 using a gate connector 238. The gate connector 238 may extend from the gate bus 236 to connect to the gate finger 234 at a portion of the gate finger 234 that is offset from an end of the gate finger 234. In some embodiments, the gate connector 238 may extend from the gate bus 236 to connect to the gate finger 234 at a portion of the gate finger 234 that is at or below an upper surface of the gate trench 280 and/or an upper surface of the gate insulating layer 260. In some embodiments, an upper surface of the gate finger 234 may be planar.

Referring to FIGS. 2A to 2D, the gate finger 234 of the power switching device 200 may contain a conductive material, such as polysilicon, within a gate trench 280. The gate finger 234 may be on a gate insulating layer 260 that is also within the gate trench 280. A dielectric layer 215 may cover the gate finger 234 in the active region 102.

Unlike prior devices, the conductive material of the gate finger 234 may not extend on a surface 206A of the semiconductor layer structure 206 in the inactive region 104 (e.g., above an upper surface of the gate trench 280 and/or gate insulating layer 260). Instead, the gate finger 234 may remain substantially within the gate trench 280 (e.g., may stay below the upper surface of the gate trench 280 and/or gate insulating layer 260). For example, an upper surface 234A of the gate finger 234 may be at or below an upper surface 260A of the gate insulating layer 260 and/or an upper surface 206A of the semiconductor layer structure 206.

In some embodiments, the upper surface 234A of the gate finger 234 may be planar. In contrast to the embodiment illustrated in FIG. 1G, the planar upper surface 234A of the gate finger 234 may avoid the formation of corners within an upper or lower portion of the gate finger 234 that may result in a concentration of an electric field during operation of the power switching device 200.

Instead of extending the conductive material of the gate finger 234 onto the upper surface 206A of the semiconductor layer structure 206 in the inactive region 104, the connection between the gate bus 236 and the gate finger 234 may instead be made through the gate connector 238. The gate connector 238 may be connected (e.g., may physically contact and/or be integrally formed with) the gate bus 236. The gate connector 238 may extend (e.g., horizontally) over the gate finger 234 and may vertically overlap the gate finger 234. In some embodiments, an upper surface of the gate connecter 238 may be coplanar with an upper surface of the gate bus 236. The gate connector 238 may be referred to herein as a portion of the gate base 236. Thus, a first portion of the gate bus 236 (the gate connector 238) may extend from a second portion of the gate bus 236 (in the inactive region 104) to overlap the gate finger 234 in the active region 102. In some embodiments, the gate connecter 238 may only vertically overlap an end portion of the gate finger 234. A via 245 may extend (e.g., vertically) between the gate connector 238 and the gate finger 234, to electrically connect the gate connector 238 to the gate finger 234 in the gate trench 280.

In some embodiments, the gate finger 234 may extend in a first direction (e.g., an X direction in FIGS. 2A to 2D). At least a portion of the gate bus 236 may extend in a second direction (e.g., a Y direction in FIGS. 2A to 2D) that intersects the first direction. The gate connector 238 may extend in the first direction from the gate bus 236 to a position on the gate finger 234. The via 245 may extend in a third direction (e.g., a Z direction in FIGS. 2A to 2D) that intersects both the first and second directions.

In some embodiments, the dielectric layer 215 may separate the gate connector 238 from the gate finger 234. In some embodiments, the thickness T of the dielectric layer 215 may be 1 to 10 times the thickness of the gate insulating layer 260. In some embodiments, the thickness T of the dielectric layer 215 may be 2 to 5 times the thickness of the gate insulating layer 260. The dielectric layer 215 may be or include an $SiO_2$ layer, $SiO_xN_y$, $Si_xN_y$, $Al_2O_3$ and/or high-K dielectrics such as hafnium oxide, hafnium silicate, $HfSi_xO_yN_z$, or mixtures of hafnium-silicon oxy-nitrides with other oxides such as $La_2O$. In some embodiments, the via 245 may extend through the dielectric layer 215 to contact the gate finger 234. The via 245 may be offset by a distance D from an end 234E of the gate finger 234. The distance D may range from 0.2 μm to 10 μm. In some embodiments, the distance D may range from 0.5 μm to 8 μm. In some embodiments, the distance D may range from 1 μm to 5 μm. The "end" 234E of the gate finger 234 refers to the portion(s) of the gate finger 234 that is disposed at the farthest point of gate finger 234 on the longitudinal axis along which the gate finger 234 extends. According to some embodiments of the present disclosure, an end 234E of the gate finger 234 may be within the active region 102.

In some embodiments, the gate connector 238 and/or the via 245 may be made of a same or similar material (e.g., a metal) as the gate bus 236. In some embodiments, the gate connector 238 may be formed at the same time as the gate bus 236. For example, in some embodiments a conductive layer, such as metal, may be deposited and patterned to form the gate bus 236, the via 245, and the gate connector 238. Thus, in some embodiments, the gate bus 236, the via 245, and the gate connector 238 may be integrally connected.

By utilizing the gate connector 238 and the via 245, embodiments of the present disclosure avoid having to extend the conductive material of the gate finger 234 out of the gate trench 280 and into the inactive region 104 to connect to the gate bus 236. As a result, a corner of the conductive material of the gate finger 234 that can serve to concentrate electrical fields is not formed at the transition between the active region 102 and the inactive region 104. Moreover, the use of the gate connector 238 and the via 245 may increase a portion of the path that is composed of a highly conductive substance (e.g., metal). In some embodiments, the material of the gate connector 238 and/or via 245 (e.g., metal) may have a lower resistance than the material of the gate finger 234 (e.g., poly Si). As a result, the use of the gate connector 238 and via 245 according to embodiments of the present disclosure may provide a resistance benefit as well. Though the description to this point has focused on one gate finger, it will be understood that the configuration described herein may be respectively applied to a plurality of the gate fingers 234 of the power switching device 200.

FIGS. 2B to 2D illustrate embodiments of the gate connector 238 that are arranged adjacent the outer periphery of the active region 102, but the embodiments of the present disclosure are not limited to such a configuration. As illustrated in FIG. 2A, the gate connectors 238 may also connect to portions of the gate bus 236 that are in internal sections (in plan view) of the active region 102. For example, the gate connectors 238 may be connected to portions of the gate bus that extend around the gate pad 132 and/or through a center of the power switching device 200.

In FIGS. 2C and 2D, the gate insulating layer 260 is illustrated as having an upper surface 260A that is coplanar with the upper surface 206A of the semiconductor layer structure 206. However, this is only an example and the present disclosure is not limited to this configuration. In some embodiments, the upper surface 260A of the gate insulating layer 260 may extend higher than the upper surface 206A of the semiconductor layer structure 206. For example, in some embodiments, the gate insulating layer 260 may extend on the upper surface 206A the semiconductor layer structure 206 (e.g., in the inactive region 104) in a similar manner as is shown in FIG. 1G. In addition, in some embodiments the upper surface 234A of the gate finger 234 may extend higher than the upper surface 206A of the semiconductor layer structure 206. For example, the upper surface 234A of the gate finger 234 may be coplanar with an upper surface 260A of the gate insulating layer 260.

The upper surface 234A of the gate finger 234 may connect to the via 245 at a point on the gate finger that is at or below the upper surface 260A of the gate insulating layer 260 and/or the upper surface 206A the semiconductor layer structure 206. In other words, an interface between the conductive material of the gate finger 234 (e.g., polysilicon) and the conductive material of the via (e.g., a material comprising metal) may occur at a position that is at or below the upper surface 260A of the gate insulating layer 260 and/or the upper surface 206A the semiconductor layer structure 206. This configuration may provide a structure that removes and/or reduces the area of electrical field concentration that is present in some devices.

Also, in FIGS. 2C and 2D, the gate connector 238 is illustrated as having a same height and/or thickness as the gate bus 236. However, this is only an example and the present disclosure is not limited to this configuration. In some embodiments, the gate connector 238 may be thicker or thinner than the gate bus 236.

FIG. 2A illustrates the use of the gate connector 238 with the gate fingers 234 that extend substantially parallel to one another in an arrangement similar to that of FIG. 1C. However, the embodiments of the present disclosure are not limited thereto. In some embodiments, the gate connectors 238 may also be utilized with gate fingers 234 that are arranged in a grid pattern, such as those illustrated in FIG. 1D. For example, the gate connectors 238 may be connected to gate fingers 234 extending in both the first direction (e.g., the X direction) and/or the (Y direction) without deviating from the scope of the present disclosure.

In FIGS. 2A to 2D, the gate connector 238 extends from the gate bus 236 in the inactive region 104 to the gate finger 234 in the active region 102, but the embodiments of the present disclosure are not limited thereto. In some embodiments, the gate finger 234 may extend into the inactive region 104 while still avoiding forming the corner that acts as an electric field concentrator illustrated in FIGS. 1A-1G.

Figure 3A:
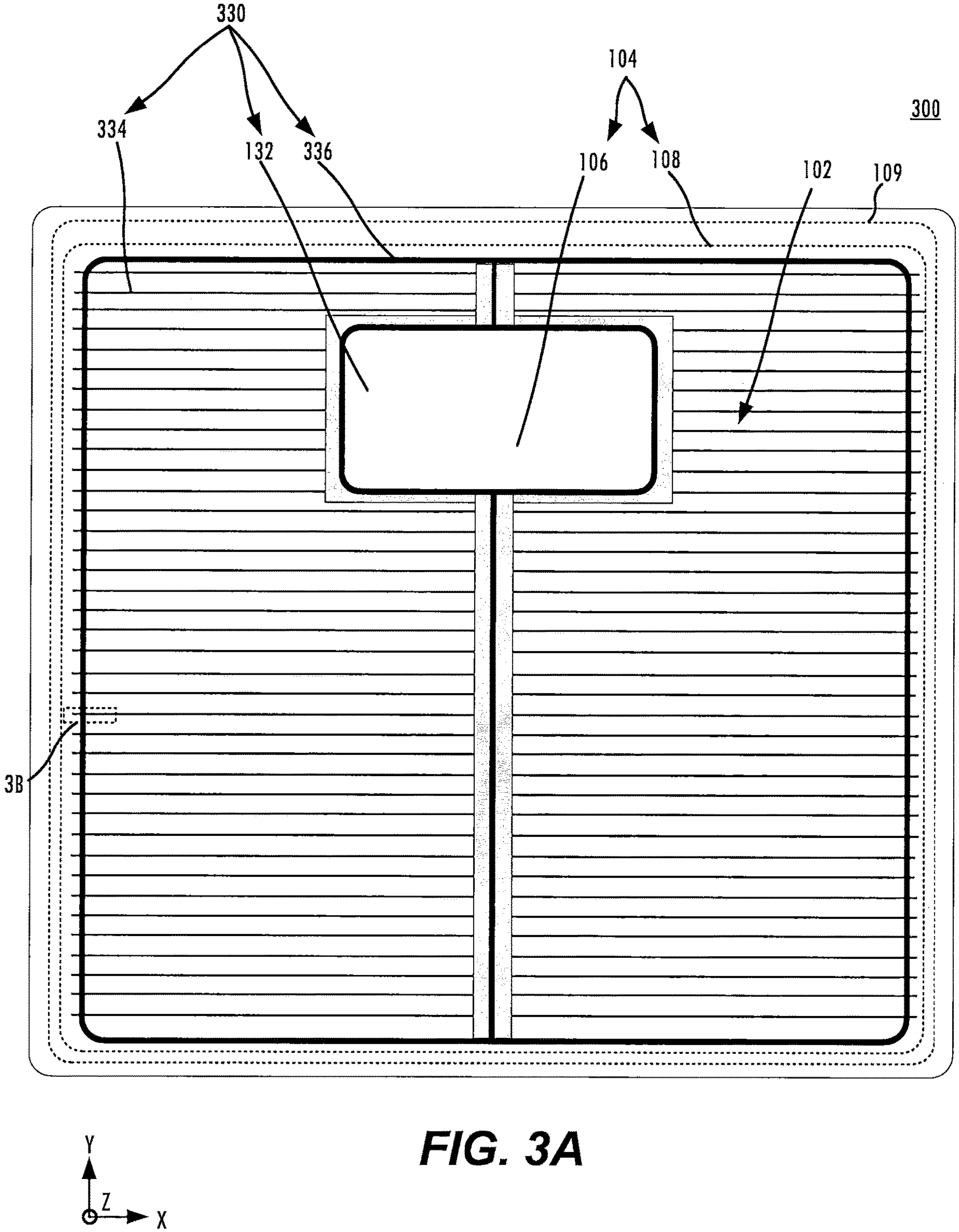
FIG. 3A is a schematic plan view of an example of a power switching device according to some embodiments of the present disclosure with the source and gate metallization removed.
Figure 3B:
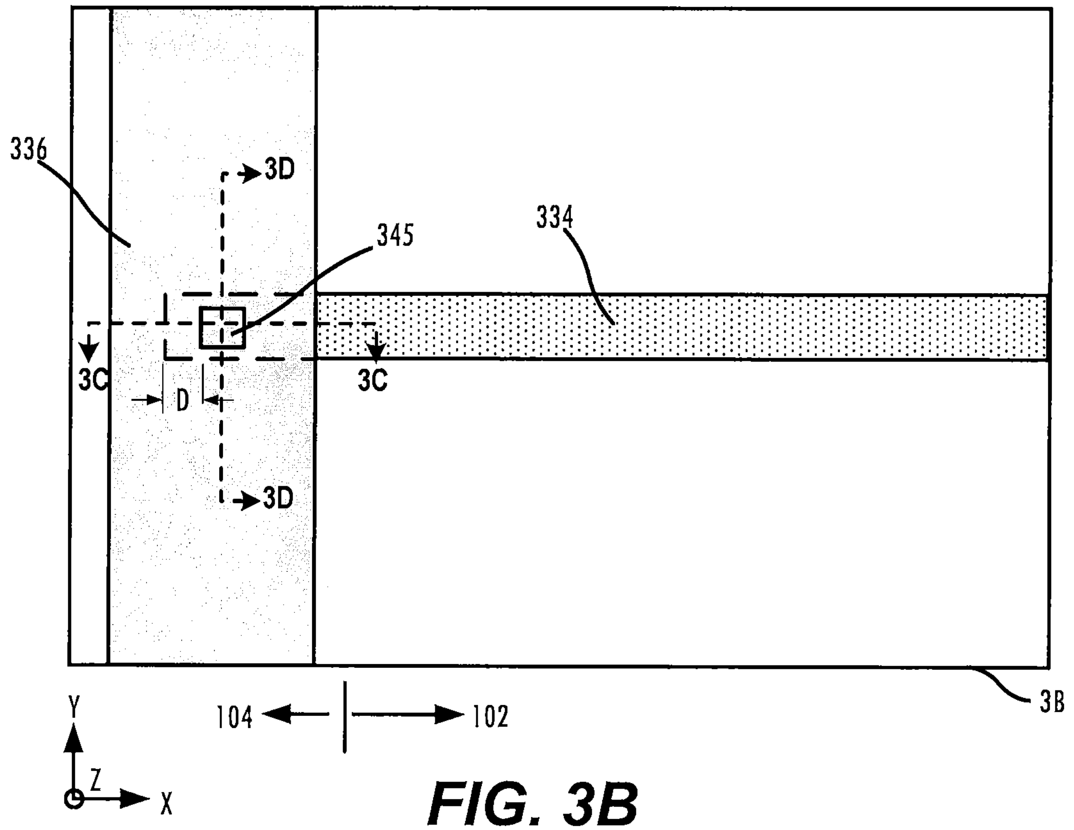
FIG. 3B is a schematic plan view of portion 3B of FIG. 3A.
Figure 3C:
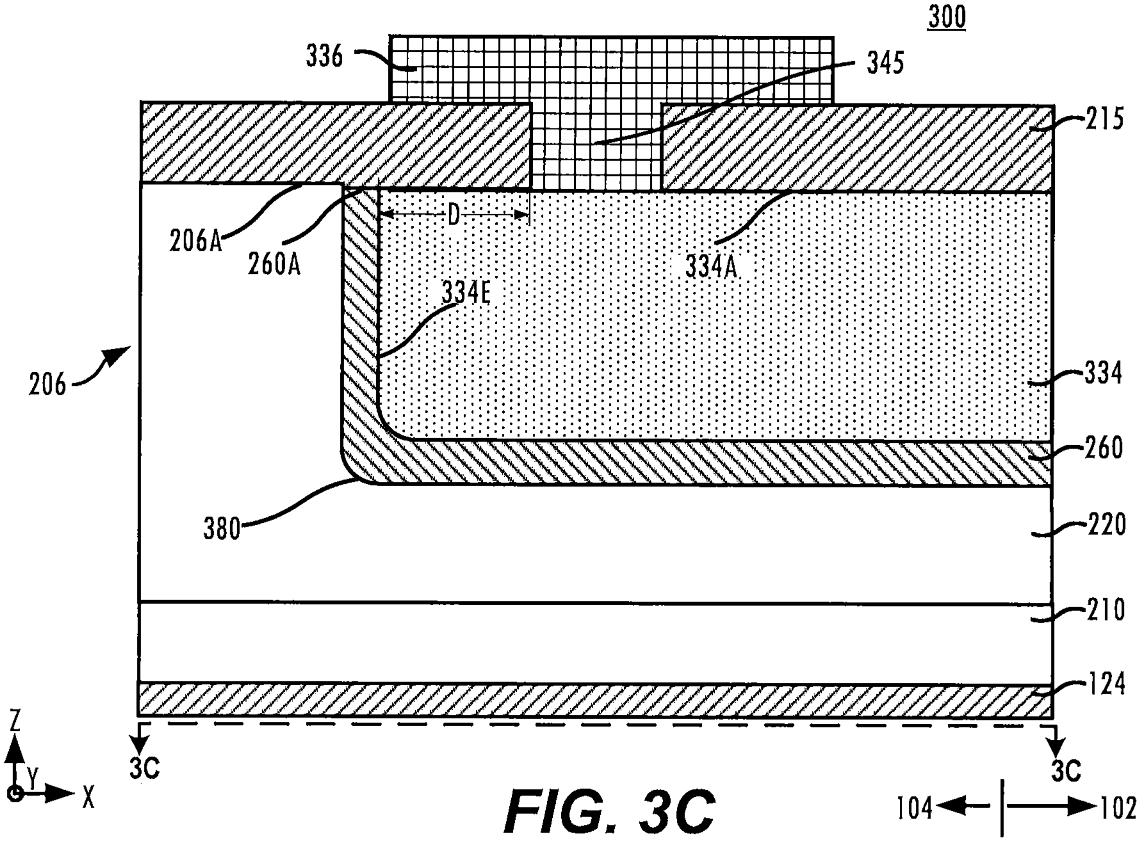
FIG. 3C is a schematic cross-sectional view taken along the line 3C-3C of FIG. 3B.
Figure 3D:
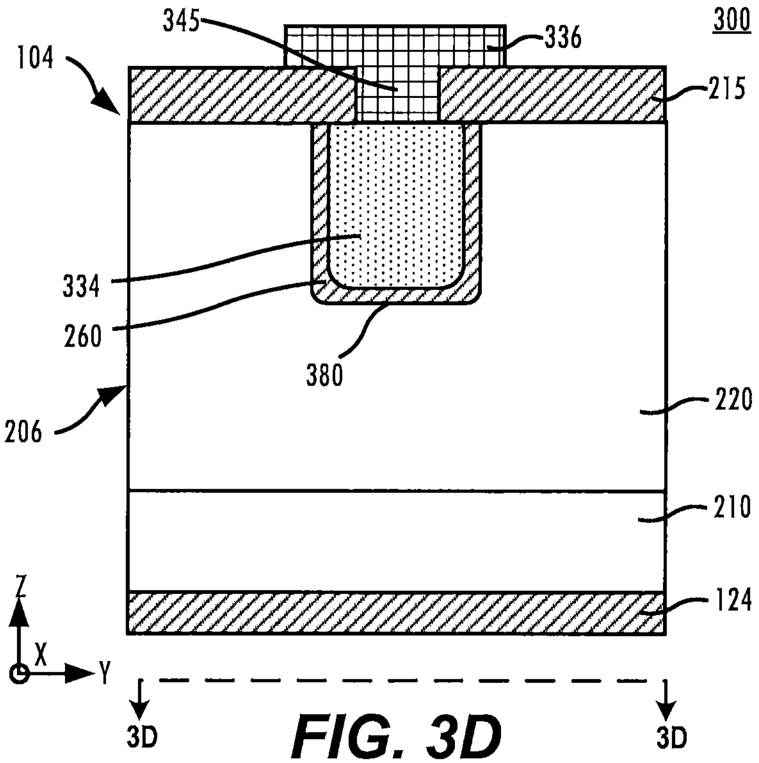
FIG. 3D is a schematic cross-sectional view taken along the line 3D-3D of FIG. 3B.

FIG. 3A is a schematic plan view of an example of a power switching device 300 according to some embodiments of the present disclosure with the source and gate metallization removed. FIG. 3A represents a view of the device that is similar to that illustrated in FIG. 1C. As a result, a description of portions of FIG. 3A that are similar to those of FIG. 1C will be omitted for brevity. FIG. 3B is a schematic plan view of portion 3B of FIG. 3A. FIG. 3C is a schematic cross-sectional view taken along the line 3C-3C of FIG. 3B. FIG. 3D is a schematic cross-sectional view taken along the line 3D-3D of FIG. 3B.

As is shown in FIG. 3A, the power switching device 300 includes a semiconductor layer structure that includes an active region 102 and an inactive region 104. The active region 102 includes a plurality of unit cell transistors coupled in parallel. The inactive region 104 includes a gate pad portion 106 and a termination portion 108. The termination portion 108 may include termination structures (shown as guard rings 109).

As is further shown in FIG. 3A, a gate electrode structure 330 may be provided that includes a gate pad 132, a plurality of gate fingers 334, and one or more gate buses 336 that electrically connect the gate fingers 334 to the gate pad 132. The gate fingers 334 may extend (e.g., horizontally) across the active region 102.

The gate buses 336 may extend in the inactive region 104 of the power switching device 200 and convey a gate signal to the gate fingers 334. For example, in some embodiments, a gate bus 336 may extend in the inactive region 104 around a circumference of the active region 102. In general, the material utilized in the gate bus 336 (which may be or contain, e.g., metal) may have a lower resistivity than that used in the gate fingers 334 (which may be or contain, e.g., polysilicon or silicide).

The gate fingers 334 may distribute a gate signal of the power switching device 300 throughout the active region 102. In some embodiments, gate fingers and/or stripes 334 of a gate electrode may have a longitudinal axis that extends in a common direction (e.g., the X direction in FIG. 3A). In some embodiments, the gate fingers 334 may include a conductive material (e.g., poly Si or a silicide). The gate fingers 334 may be implemented in a trench configuration, in which a portion of the gate finger 334 extends below an upper surface of the semiconductor layer structure.

Unlike the previously-described embodiment, the gate fingers 334 of the power switching device 300 may connect to the gate bus 336 through a via 345 in the inactive region 104. Referring to FIGS. 3A to 3D, the gate finger 334 may be on a gate insulating layer 260 that is also within a gate trench 380. A dielectric layer 215 may cover the gate finger 334 in the active region 102.

Unlike prior devices, the gate finger 334 may not extend on a surface 206A of the semiconductor layer structure 206 in the inactive region 104. Instead, the gate finger 334 may remain substantially within the gate trench 380, and the gate trench 380 may extend from the active region 102 into the inactive region 104. In other words, the gate trench 380 may be longer than the gate trench 280 of FIGS. 2A to 2D. The gate trench 380 may have a first portion (e.g., a majority) within the active region 102, but a second portion of the gate trench 380 may continuously extend into the inactive region 104. In some embodiments, the gate trench 380 may extend beneath the gate bus 336 such that the gate bus 336 vertically overlaps the gate trench 380.

In some embodiments, an upper surface 334A of the gate finger 334 may be at or below an upper surface 260A of the gate insulating layer 260 and/or an upper surface 206A of the semiconductor layer structure 206. That is to say that the conductive material (e.g., poly Si) of the gate finger 334 may remain within the gate trench 380 and not extend out of the gate trench 380 to connect to the gate bus 336 (e.g., may stay below an upper surface of the gate trench 380). In some embodiments, the upper surface 334A of the gate finger 334 may be substantially planar. As used herein, "substantially planar" means that the surface is smooth but may include portions that are slightly uneven, i.e., may include imperfections consistent with the manufacturing process used to create the gate finger 334.

Instead of extending the conductive material of the gate finger 334 onto the upper surface 206A of the semiconductor layer structure 206 in the inactive region 104, the electrical connection between the gate bus 336 and the gate finger 334 may be made through the via 345 that extends (e.g., vertically) through the dielectric layer 215. In some embodiments, the via 345 may be disposed in the inactive region 104. For example, in some embodiments, the via 345 may be located between the termination portion 108 of the inactive region 104 and the active region 102.

In some embodiments, the gate finger 334 may continuously extend in a first direction (e.g., an X direction in FIGS. 3A to 3D) from the active region 102 to the inactive region 104. At least a portion of the gate bus 336 may extend in a second direction (e.g., a Y direction in FIGS. 3A to 3D) that intersects the first direction. The via 345 may extend in a third direction (e.g., a Z direction in FIGS. 3A to 3D) that intersects both the first and second directions.

In some embodiments, the via 345 may be offset by a distance D from an end 334E of the gate finger 334. The distance D may range from 0.2 μm to 10 μm. In some embodiments, the distance D may range from 0.5 μm to 8 μm. In some embodiments, the distance D may range from 1 μm to 5 μm. According to some embodiments of the present disclosure, the end 334E of the gate finger 334 may be within the inactive region 104.

By extending the gate finger 334 into the inactive region 104 and electrically connecting to the gate bus 336 utilizing the via 345, embodiments of the present disclosure avoid having to extend the conductive material of the gate finger 334 onto a surface 206A of the semiconductor layer structure 206. In some embodiments, the conductive material of the gate finger 334 may remain below an upper surface of the gate trench 380 and/or an upper surface 260A of the gate insulating layer 260. As a result, a corner of the conductive material of the gate finger 334 that can serve to concentrate electrical fields is not formed at the transition between the active region 102 and the inactive region 104.

In some embodiments, a width of the gate finger 334 in the active region 102 may be relatively narrow for improving and/or optimizing the device properties. For example, in some embodiments, a width of the gate finger 334 in the second direction (e.g., the Y direction in FIGS. 3A to 3D) may be as narrow as 0.6 μm. In some embodiments, however, the width of the gate trench 380, and thus the gate finger 334, may be made wider in the inactive region 104 so as to have a better contact area.

Figure 3E:
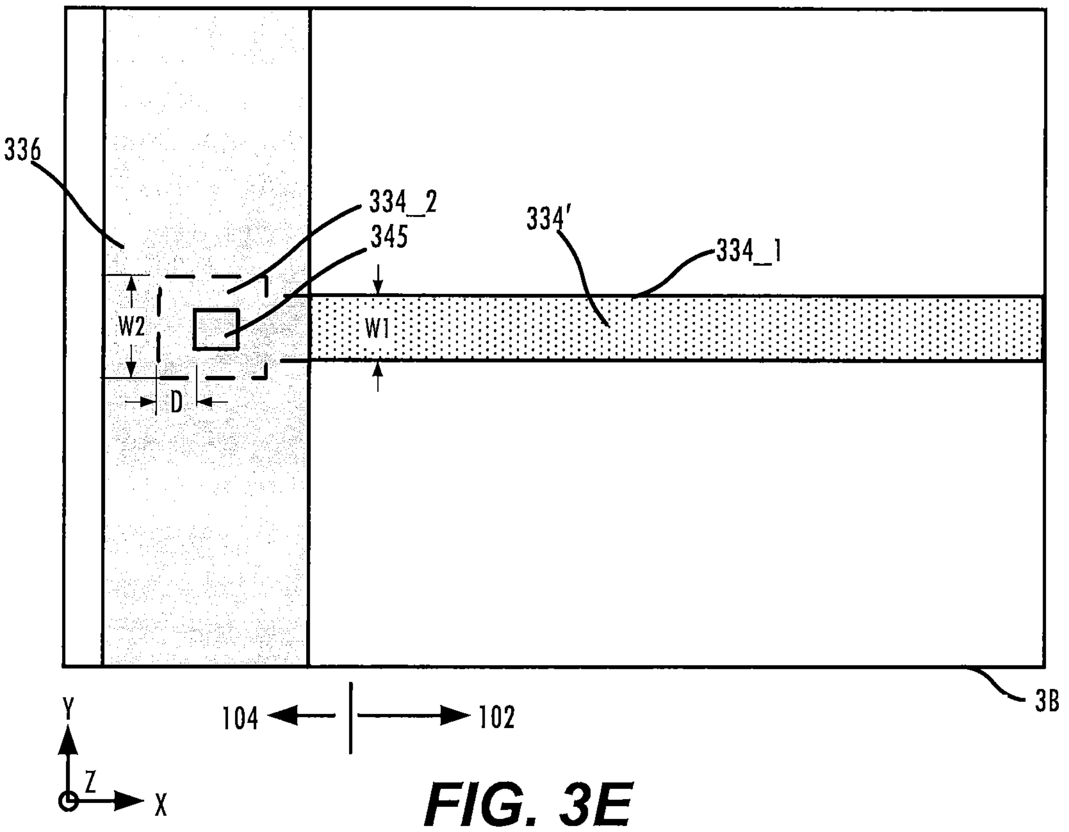
FIG. 3E is a schematic plan view of portion 3B of FIG. 3A that illustrates additional embodiments of the present disclosure.

FIG. 3E is a schematic plan view of portion 3B of FIG. 3A that incorporates additional embodiments of the present disclosure. Referring to FIG. 3E, in some embodiments a gate finger 334' may include a first portion 334_1 and a second portion 334_2. The first portion 334_1 of the gate finger 334' may have a first width W1 and may be located in the active region 102. The second portion 334_2 of the gate finger 334' may have a second width W2 and may be located in the inactive region 104. The second width W2 may be larger than the first width W1. The via 345 may electrically connect the gate bus 336 to the second portion 334_2 of the gate finger 334' in the inactive region 104. Thus, the second portion 334_2 of the gate finger 334' may form a contact region for the via 345. The larger width W2 of the second portion 334_2 may provide an increased contact area for the via 345. Accordingly, it may be easier to accurately place the via 345 to provide the electrical connection between the gate bus 336 and the gate finger 334'. In some embodiments, the via 345 of the embodiment of FIG. 3E may be larger (e.g., have a larger cross-sectional area) than the via 345 of the embodiment of the FIG. 3B, but the present disclosure is not limited thereto. Increasing a size (e.g., a cross-sectional area) of the via 345 may improve the resistance of the gate electrode.

Figure 3F:
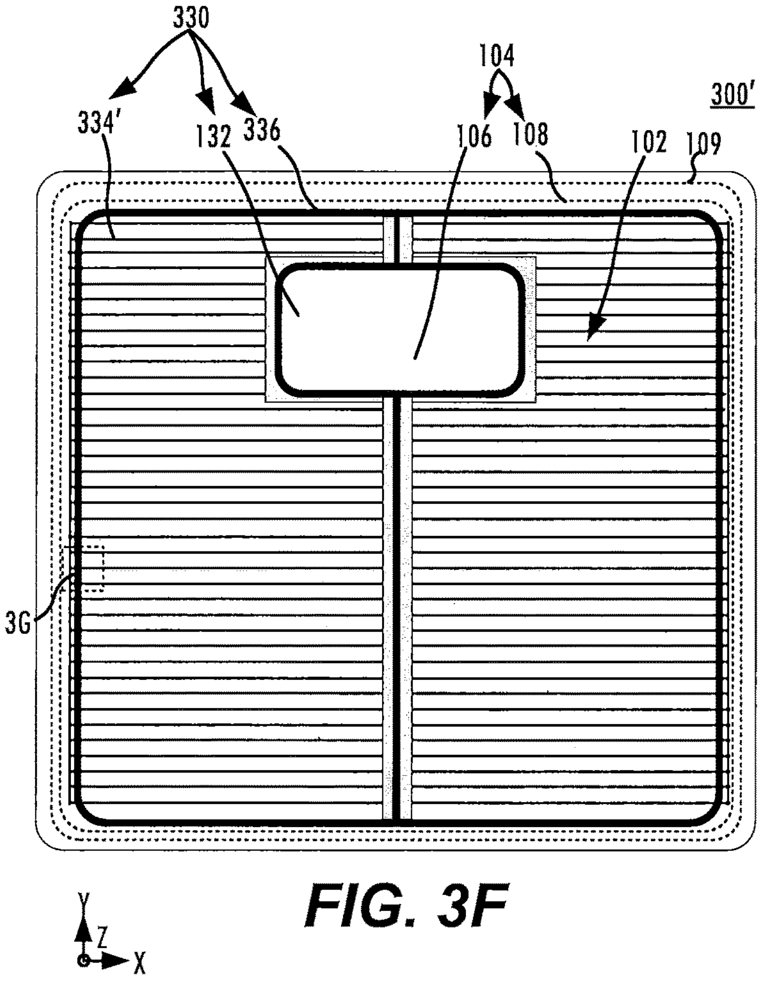
FIG. 3F is a schematic plan view of an example of a power switching device according to some embodiments of the present disclosure with the source and gate metallization removed.
Figure 3G:
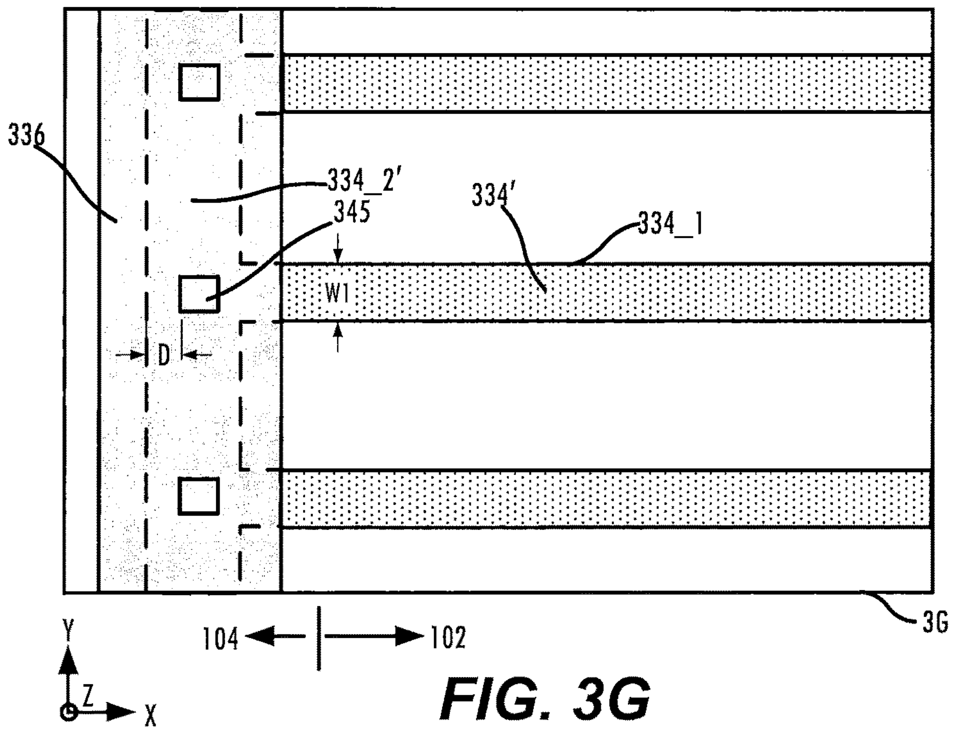
FIG. 3G is a schematic plan view of portion 3G of FIG. 3F.

In FIG. 3E, the second portion 334_2 of the gate finger 334' is illustrated having a width W2 that leaves a separation between respective ones of the gate fingers 334'. In some embodiments, the width of the second portion 334_2 of the gate finger 334' could be widened to the point of it being a continuous trench that extends under the gate bus 336. FIG. 3F is a schematic plan view of an example of a power switching device 300' according to some embodiments of the present disclosure with the source and gate metallization removed. FIG. 3G is a schematic plan view of portion 3G of FIG. 3F. A description of elements of FIGS. 3F and 3G that have been previously described will be omitted for brevity. In FIG. 3G, the portion 3G illustrates a plurality of gate fingers 334' extending parallel to one another. FIGS. 3F and 3G illustrate additional embodiments of the present disclosure in which the respective gate fingers 334' are interconnected by a gate trench in the inactive region 104. In some embodiments, for example, a second portion 334_2' of the gate finger 334' may extend between adjacent gate fingers 334' so that the plurality of gate fingers 334' are connected. The second portion 334_2' may connect the end portions (e.g., the end of the gate trench) of the plurality of gate fingers 334'. In this manner each of the trenched portions of the gate fingers 334' may end in a 'T' configuration. In other words, the first portion 334_1 of the gate finger 334' may extend in a gate trench a first direction (e.g., an X direction in FIG. 3G) and the second portion 334_2' of the gate finger(s) 334' may extend in a gate trench in a second direction (e.g., the Y direction in FIG. 3G) to connect respective ones of the gate fingers 334'. One or more via 345 may vertically extend from the gate bus 336 to the second portion 334_2' of the gate fingers 334'. In some embodiments, the interconnection of the gate fingers 334' may allow for the vias 345 to be variously located along the second portion 334_2'. In some embodiments, the vias 345 may be offset from an outermost edge of the second portion 334_2' of the gate fingers 334' by the distance D.

In FIGS. 3C and 3D, the gate insulating layer 260 is illustrated as having an upper surface 260A that is coplanar with the upper surface 206A of the semiconductor layer structure 206. However, this is only an example and the present disclosure is not limited to this configuration. In some embodiments, the upper surface 260A of the gate insulating layer 260 may extend higher than the upper surface 206A of the semiconductor layer structure 206. For example, in some embodiments, the gate insulating layer 260 may extend on the upper surface 206A the semiconductor layer structure 206 (e.g., in the inactive region 104) in a similar manner as is shown in FIG. 1G. In addition, in some embodiments the upper surface 334A of the gate finger 334 may extend higher than the upper surface 206A of the semiconductor layer structure 206. For example, the upper surface 334A of the gate finger 334 may be coplanar with an upper surface 260A of the gate insulating layer 260.

FIG. 3A illustrates the extension of the gate fingers 334 into the inactive region 104 for gate fingers 334 that extend substantially parallel to one another in an arrangement similar to that of FIG. 1C. However, the embodiments of the present disclosure are not limited thereto. In some embodiments, gate fingers 334 that are arranged in a grid pattern, such as those illustrated in FIG. 1D, may also be configured to extend into the inactive region 104. For example, gate fingers 334 extending in both the first direction (e.g., the X direction) and the (Y direction) may be configured to extend continuously into the inactive region 104 to connect to the gate bus 336 using vias 345 without deviating from the scope of the present disclosure.

The use of vias 245, 345 between the gate bus 236, 336 and the gate finger 234, 334 may be leveraged in additional ways to improve a performance of the device. In some embodiments, additional gate connections may be provided that extend across the active region 102.

Figure 4A:
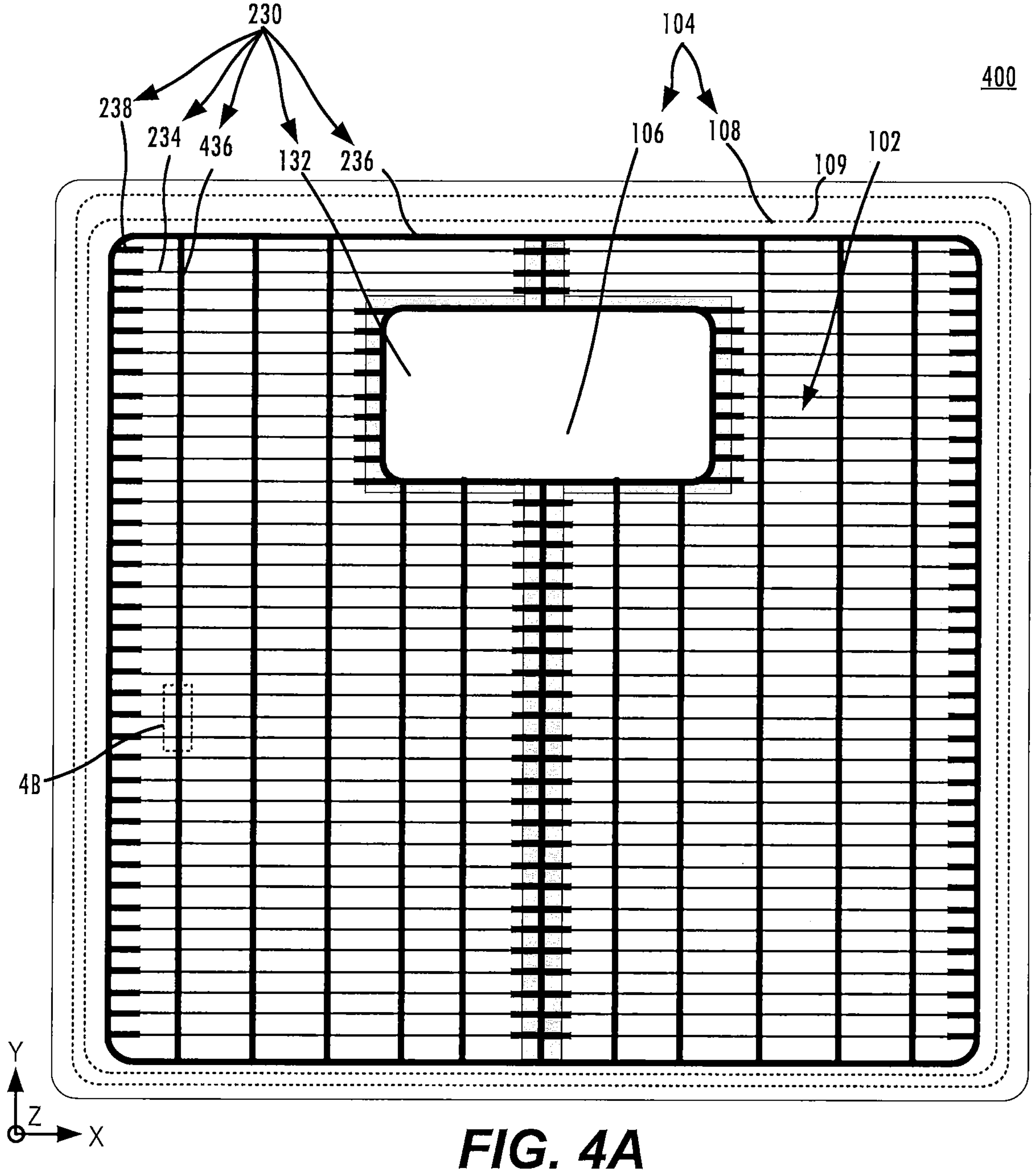
FIG. 4A is a schematic plan view of an example of a power switching device according to some embodiments of the present disclosure with the source and gate metallization removed.
Figure 4B:
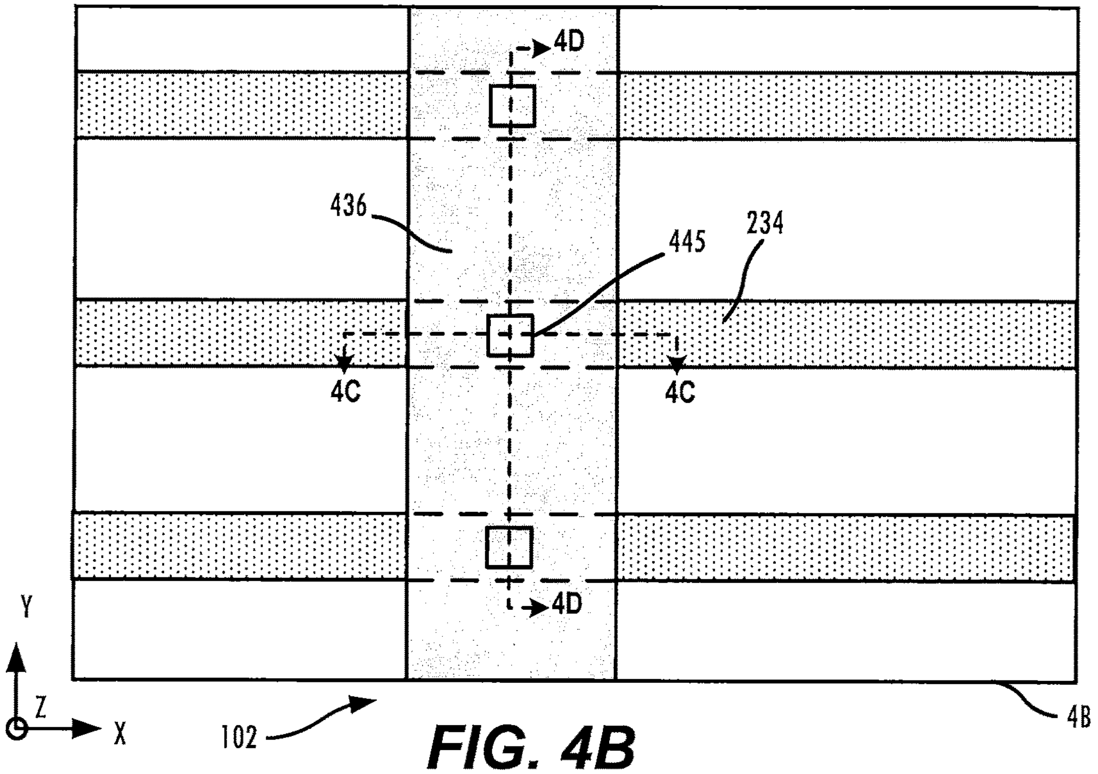
FIG. 4B is a schematic plan view of portion 4B of FIG. 4A.
Figure 4C:
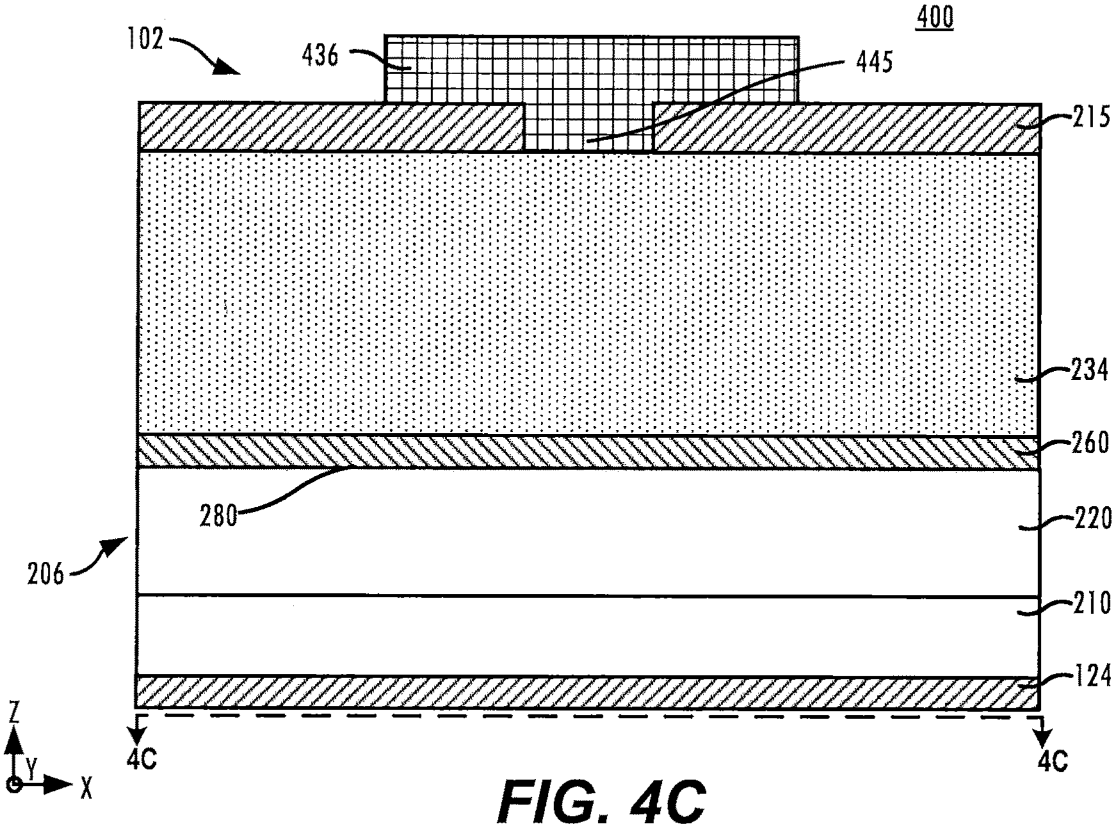
FIG. 4C is a schematic cross-sectional view taken along the line 4C-4C of FIG. 4B. FIG., 4D is a schematic cross-sectional view taken along the line 4D-4D of FIG. 4B.
Figure 4D:
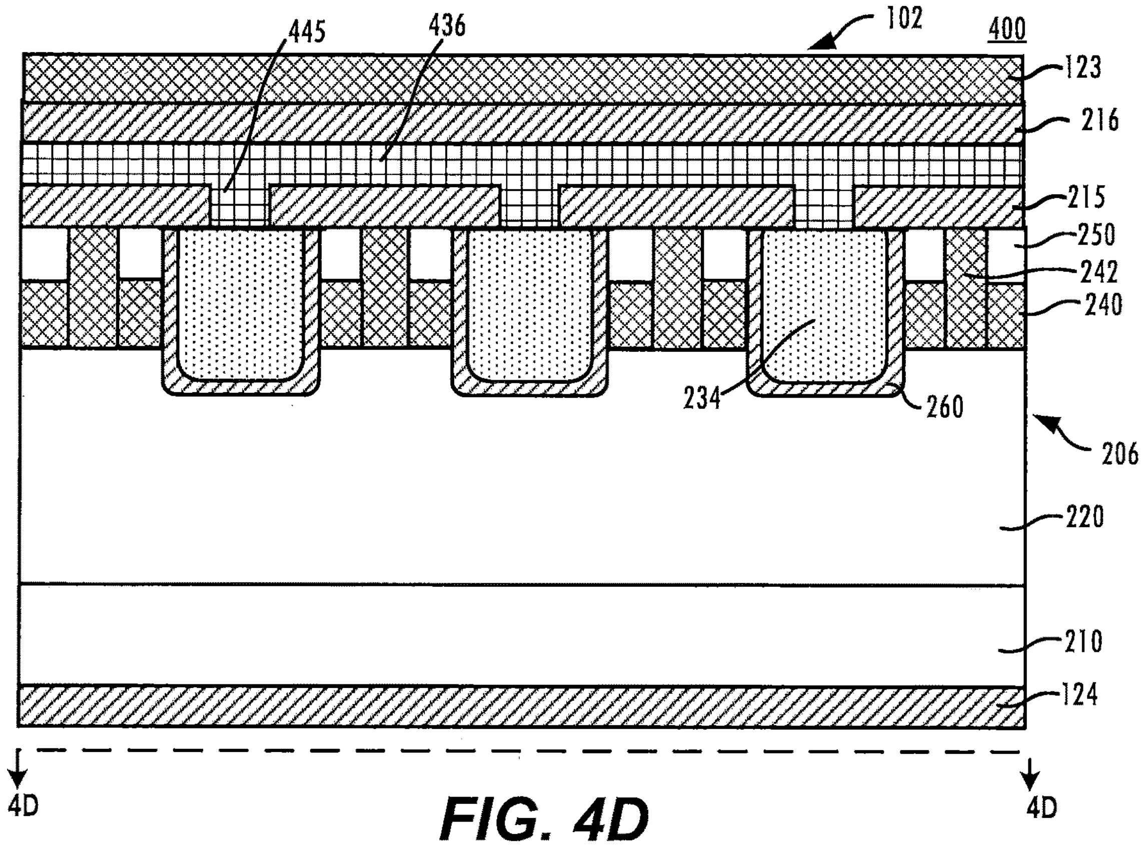
FIG. 4E is a schematic cross-sectional view taken along the line 4D-4D of FIG. 4B that illustrates an additional embodiment of the present disclosure.
FIG. 4F is a schematic plan view of a power switching device that incorporates an embodiment similar to that of FIG. 3A, with the addition of gate runners.

FIG. 4A is a schematic plan view of an example of a power switching device 400 according to some embodiments of the present disclosure with the source and gate metallization removed. FIG. 4A represents a view of the device that is similar to that illustrated in FIG. 2A. As a result, a description of portions of FIG. 4A that are similar to those previously described will be omitted for brevity. FIG. 4B is a schematic plan view of portion 4B of FIG. 4A. FIG. 4C is a schematic cross-sectional view taken along the line 4C-4C of FIG. 4B. FIG. 4D is a schematic cross-sectional view taken along the line 4D-4D of FIG. 4B.

Referring to FIG. 4A, the power switching device 400 may be similar to that of FIG. 2A with the addition of gate runners 436. The gate runners 436 may extend in a direction that is perpendicular to the gate fingers 234. For example, if the gate fingers 234 extend in the first direction (e.g., the X direction), the gate runners 436 may extend in the second direction (e.g., the Y direction).

The gate runners 436 may be a part of the gate electrode structure 230. For example, the gate runners 436 may be electrically connected to the gate bus 236. In some embodiments, the gate runner 436 may be made of a same or similar material (e.g., a metal) as the gate bus 236. In some embodiments, the gate runner 436 may be formed at the same time as the gate bus 236. For example, in some embodiments a conductive layer, such as metal, may be deposited and patterned to form the gate bus 236, the gate connectors 238, and/or the gate runners 436. Thus, in some embodiments, the gate bus 236 and the gate runner 436 may be integrally connected.

Referring to FIGS. 4A to 4D, the gate runner 436 may extend above (e.g., vertically overlap) a portion of one or more of the gate fingers 234 and vias 445 may electrically connect the gate runner 436 to the one or more of the gate fingers 234. In some embodiments, the dielectric layer 215 may separate the gate runner 436 from the gate finger 234. In some embodiments, the via 445 may extend through the dielectric layer 215 to contact the gate finger 234. The via 445 may connect to one or more of the gate fingers 234 at internal positions of the gate finger 234 (e.g., positions between opposing ends of the gate finger 234).

By using the gate runners 436, additional connections may be made between the gate bus 236 and one or more of the gate fingers 234. The gate runners 436 may be formed of a material (e.g., metal) that has a lower resistivity than the material of the gate finger 234. In addition, the gate runners 436 may have a larger cross-sectional area than the gate finger 234. As a result, the gate runners 436 may have reduce a resistance to provide the gate signal from the gate bus 236 and the gate finger 234. Thus, a device incorporating the gate runners 436 may have improved performance and/or gate resistance as compared to devices not utilizing such gate runners.

In some embodiments, the gate runners 436 may be separated from the source metal layer 123. For example, as illustrated in FIG. 4D, the gate runner 436 may be separated from the source metal layer by a second dielectric layer 216. In some embodiments, the second dielectric layer 216 may be formed of a same or similar material as the dielectric layer 215. For example, the second dielectric layer 216 may be or include an $SiO_2$ layer, $SiO_xN_y$, $SiN_y$, $Al_2O_3$ and/or high-K dielectrics such as hafnium oxide, hafnium silicate, $HfSi_xO_yN_z$, or mixtures of hafnium-silicon oxy-nitrides with other oxides such as $La_2O$. In some embodiments, the dielectric layer 215 and the second dielectric layer 216 may be integrally connected. Though not explicitly shown in FIG. 4D, the source metal layer may be connected to the source regions 250 by conductive vias or other conductive paths that extend through the dielectric layer 215 and/or the second dielectric layer 216 and are separated from the gate runner 436. Thus, an electrical short between the gate runner(s) 436 and the source metal layer 123 may be avoided.

Figure 4E:
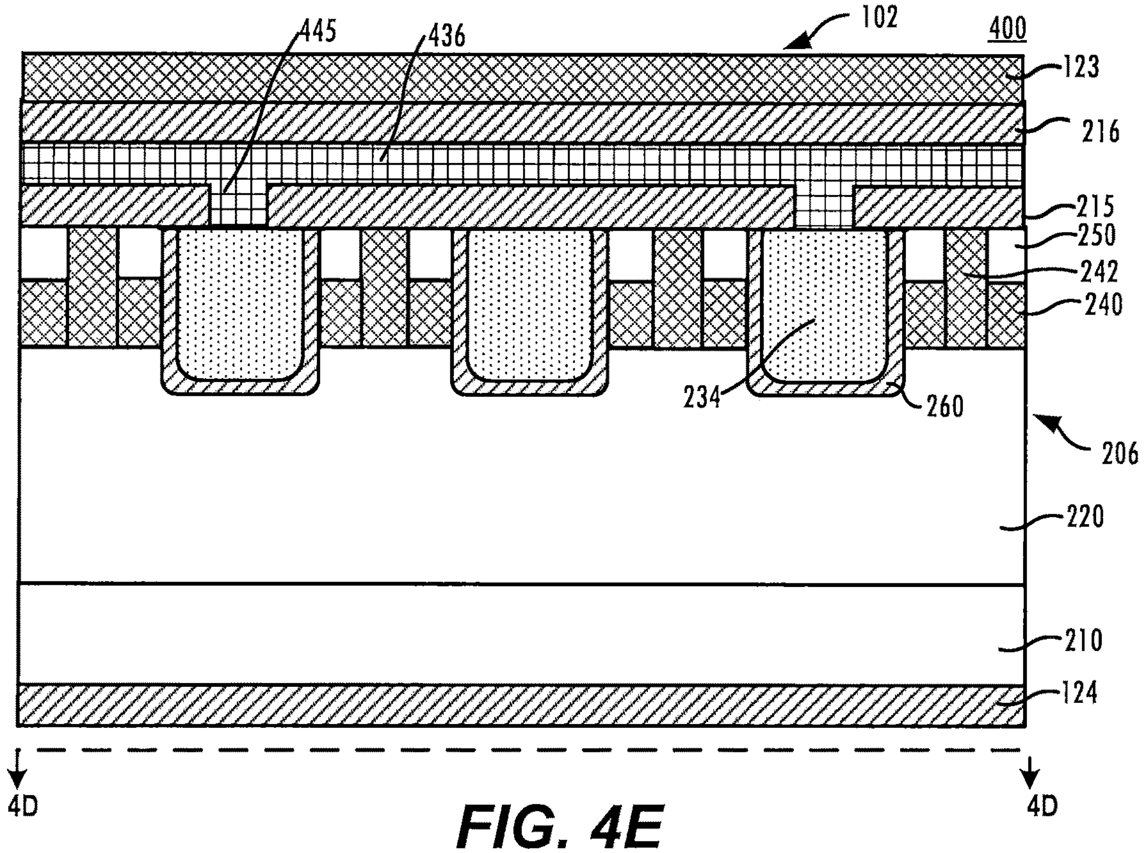

In FIG. 4B, the gate runner 436 has a via 445 that is connected to each of the gate fingers 234. However, the embodiments of the present disclosure are not limited to such a configuration. In some embodiments, the gate runner 436 may not be connected to each of the gate fingers 234 over which the gate runner 436 overlaps. In other words, in some embodiments, the via 445 may be omitted between one or more of the gate fingers 234 and the gate runner 436. FIG. 4E is a schematic cross-sectional view taken along the line 4D-4D of FIG. 4B that illustrates an additional embodiment of the present disclosure.

Referring to FIG. 4E, some of the gate fingers 234 (e.g., the middle one of three gate fingers 234 in FIG. 4E) may not have a via 445 between the gate finger 234 and the gate runner 436. This allows for selective connection between the gate fingers 234 and the gate runner 436. In some embodiments, a first gate finger 234 of the plurality of gate fingers 234 of the power switching device 400 may not be connected to a first one of the gate runners 436 by a via 445, but may be connected to a second one of the gate runners 436. Thus, in some embodiments, different ones of the gate fingers 234 may be connected to different ones of the gate runners 436.

Figure 4F:
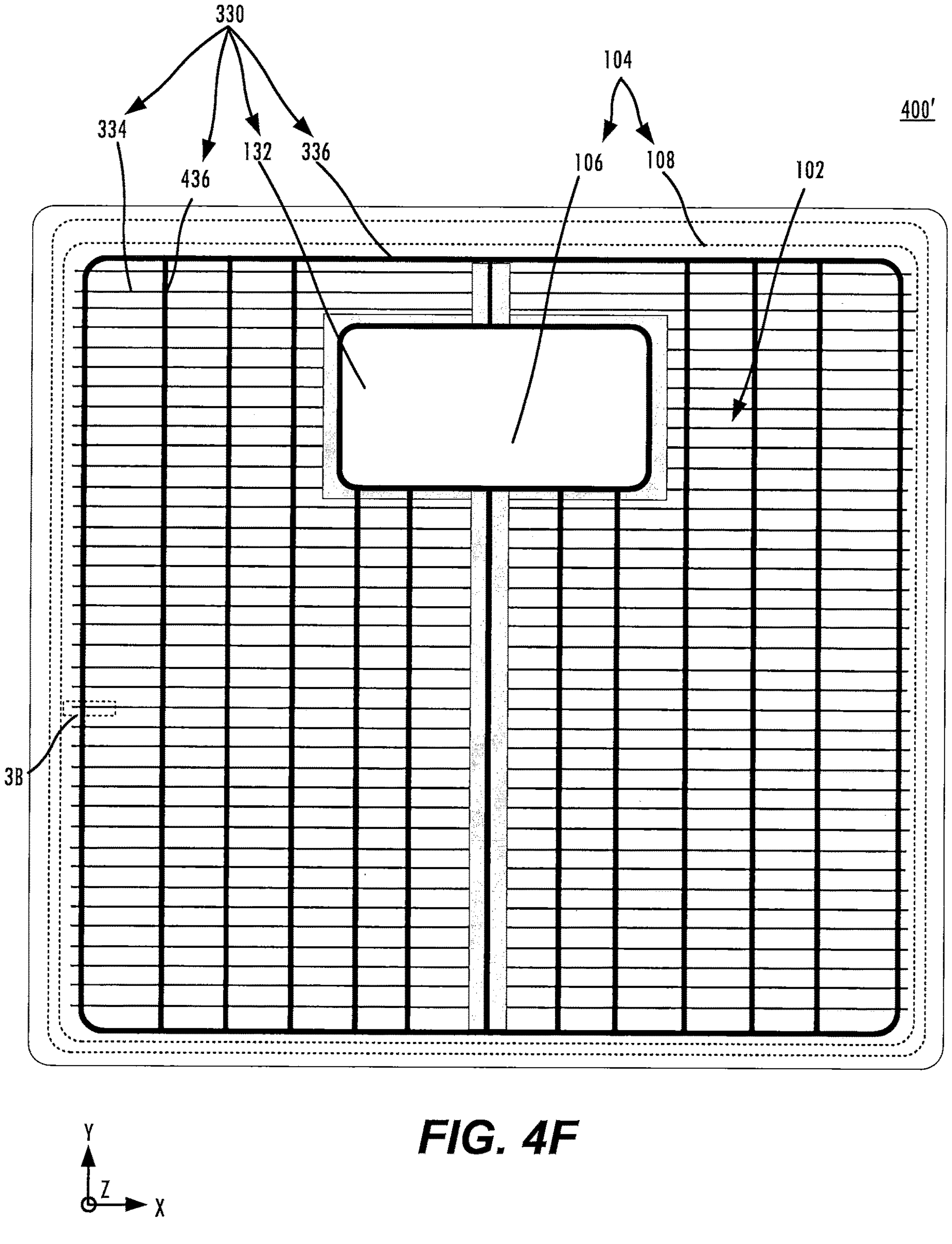

The embodiments of the power switching device 400 illustrated in FIG. 4A utilize gate connectors 238 in addition to the gate runners 436, but the embodiments of the present disclosure are not limited thereto. In some embodiments, the gate runners 436 may be utilized without the gate connectors 238. In some embodiments, the gate runners 436 may be utilized with embodiments of a power switching device that extends the gate fingers 334 into the active region 102, such as the embodiments illustrated in FIGS. 3A to 3E. FIG. 4F is a schematic plan view of a power switching device 400' that incorporates an embodiment similar to that of FIG. 3A, with the addition of the gate runners 436. A duplicate description of those features already described with respect to FIGS. 3A to 3E will be omitted.

As illustrated in FIG. 4F, the gate runners 436 may extend on the gate fingers 334 in a manner similar to that described with respect to FIGS. 4A to 4E. The gate fingers 334 may extend onto the inactive region 104 from the active region 102 to be connected to the gate bus 336. In addition, the gate runner 436 may be connected to the gate bus 336 and extend on (e.g., vertically overlap) one or more of the gate fingers 334. Vias 445 may be provided between the gate runner 436 and one or more of the gate fingers 334 so as to improve a conductivity of the gate fingers 334.

FIGS. 4A to 4F illustrate the use of gate runners 436 with gate fingers 234, 334 that extend substantially parallel to one another in an arrangement similar to that of FIG. 1C. However, the embodiments of the present disclosure are not limited thereto. In some embodiments, the gate runners 436 may also be utilized with gate fingers 234, 334 that are arranged in a grid pattern, such as those illustrated in FIG. 1D. For example, the gate runners 436 may be configured to extend the first direction (e.g., the X direction) and/or the second direction (e.g., the Y direction) to overlap one or more of the gate fingers 234, 334 and be connected to the gate fingers 234, 334 by a via 445.

FIGS. 5A to 5H are schematic cross-sectional views illustrating methods of manufacturing the power switching device of FIGS. 2A to 2D according to some embodiments of the present disclosure. FIGS. 5A, 5C, 5E, and 5G are cross-sections taken along the line 2C-2C of FIG. 2B. FIGS. 5B, 5D, 5F, and 5H are cross-sections taken along the line 2D-2D of FIG. 2B. A description of those elements of FIGS. 5A to 5H that are the same or similar to those of previously described will be omitted for brevity. Accordingly, the description of FIGS. 5A to 5H will focus on differences with the devices previously described. FIGS. 5A to 5H describe the operations that may be used to manufacture the power switching device 200 of FIGS. 2A to 2D, but it will be understood that the same or similar steps may also be used to manufacture the other power switching devices 300, 400, 400' described herein, mutatis mutandis.

Figure 5A:
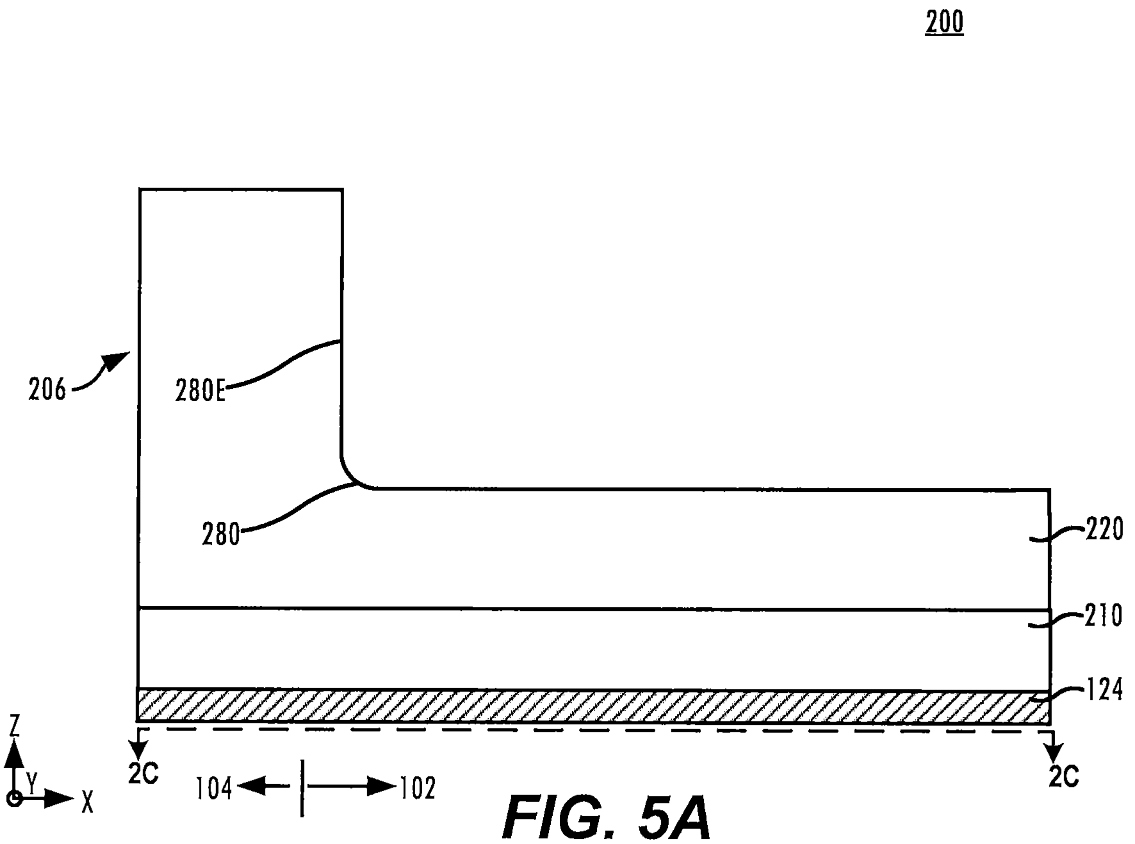
FIGS. 5A to 5H are schematic cross-sectional views illustrated methods of manufacturing power switching devices according to some embodiments of the present disclosure.
Figure 5B:
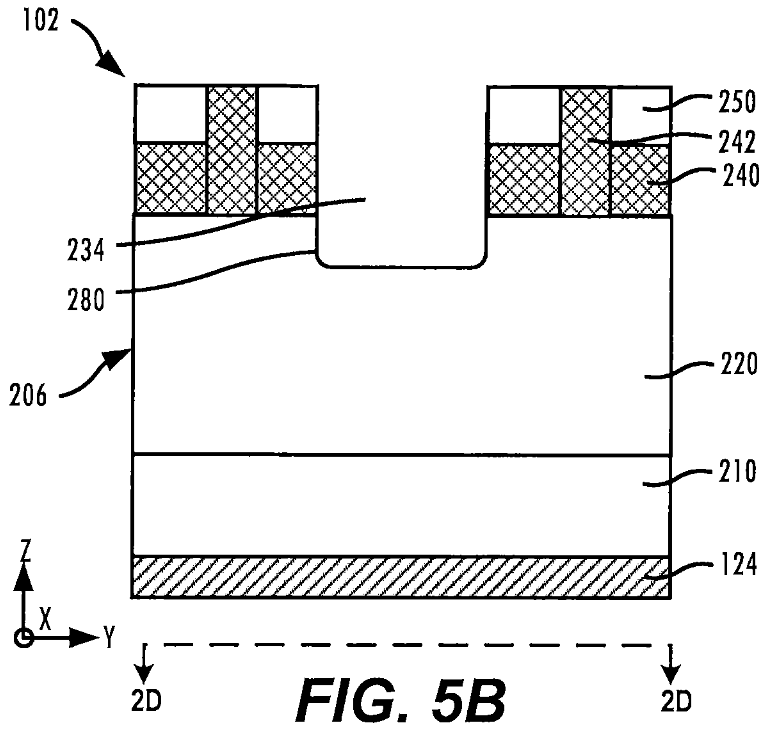

Referring to FIGS. 5A and 5B, a substrate 210 is provided and a drift region 220 is formed on the substrate 210 via epitaxial growth. In some embodiments, the substrate 210 is a heavily-doped ($n^+$) n-type silicon carbide and the drift region 220 is a lightly-doped ($n^-$) silicon carbide drift region 220. In some embodiments, an n-type silicon carbide current spreading layer may be formed that comprises the upper portion of the drift region 220.

P-wells 240 may be formed in what will be the active region 102 of the final device. In the active region 102, an upper portion 242 of each p-well 240 may be more heavily doped with p-type dopants, and heavily-doped ($n^+$) n-type silicon carbide source regions 250 may be formed in upper portions of the p-wells 240 directly adjacent and contacting the more heavily doped portions 242 of the p-wells 240. The heavily-doped ($n^+$) n-type silicon carbide regions 250 act as source regions. In some embodiments, ion implantation may be used to form the p-wells 240, 242, and the n-type source regions 250. The p-wells 240 (including the more heavily-doped upper portions 242 thereof), n-type source/drain regions 250, drift region 220, and substrate 210 may form semiconductor layer structure 206.

The semiconductor layer structure 206 may be patterned and etched to form gate trenches 280. The gate trenches 280 may extend parallel to one another in a first direction (e.g., an X direction). In some embodiments, an end 280E of the gate trench 280 may be within the active region 102. In some embodiments, the end 280E of the gate trench may be in the active region 102 and adjacent the inactive region 104. In some embodiments, such as when manufacturing the embodiments of the present invention described with respect to FIGS. 3A to 3E, the end 280E of the gate trench 280 may extend into the inactive region 104. In some embodiments, etching the gate trench 280 may include etching the gate trench 280 to have a first portion and a second portion, where a width of the second portion is wider than a width of the first portion (see, e.g., FIG. 3E).

Figure 5C:
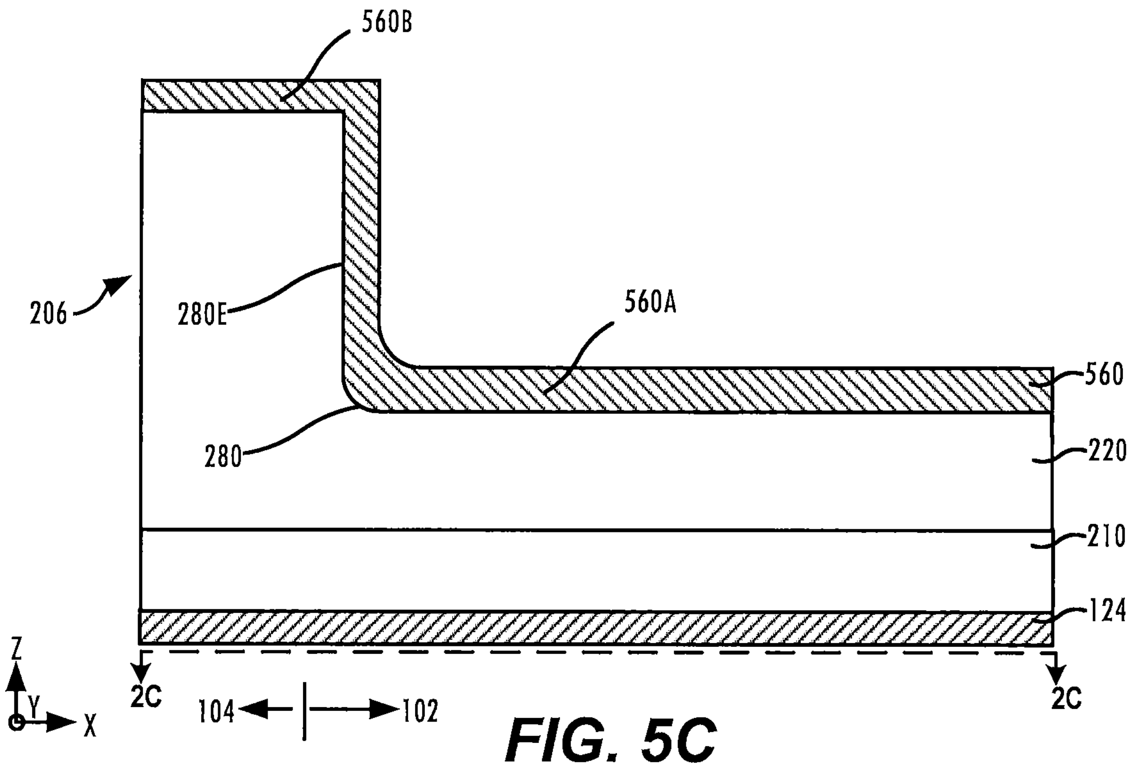
Figure 5D:
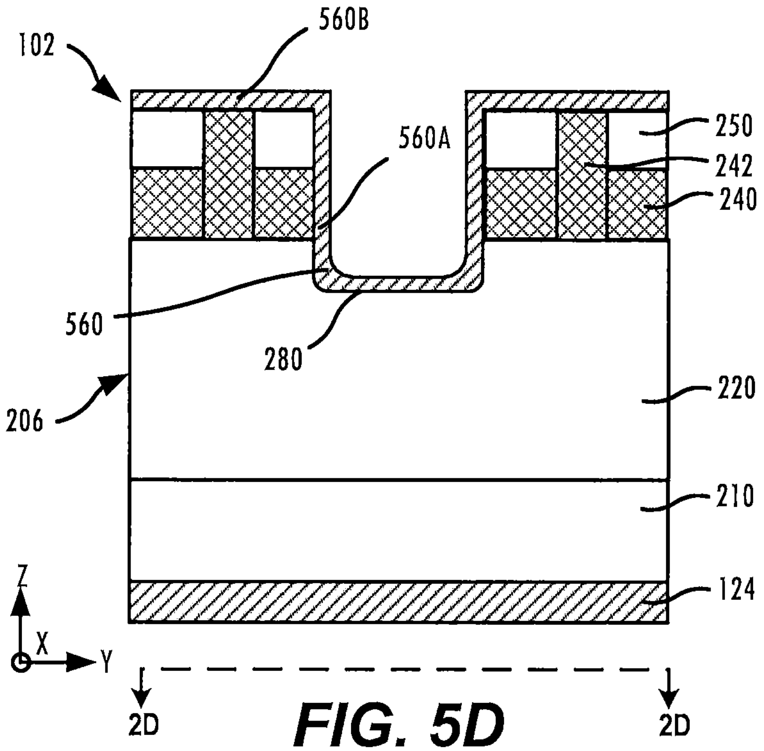

Referring to FIGS. 5C and 5D, a gate insulating material 560 may be formed on the upper surface of the semiconductor layer structure 206 and in the gate trenches 280. In some embodiments, first portions 560A of the gate insulating material 560 may be formed (e.g., deposited and/or grown) on the sidewalls and bottom of the gate trench 280. In some embodiments, second portions 560B of the gate insulating material 560 may be formed (e.g., deposited and/or grown) on the semiconductor layer structure 206 between the gate trenches 280. In some embodiments, the first and second portions 560A, 560*b* of the gate insulating material 560 may be physically connected to one another. The gate insulating material 560 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used.

Figure 5E:
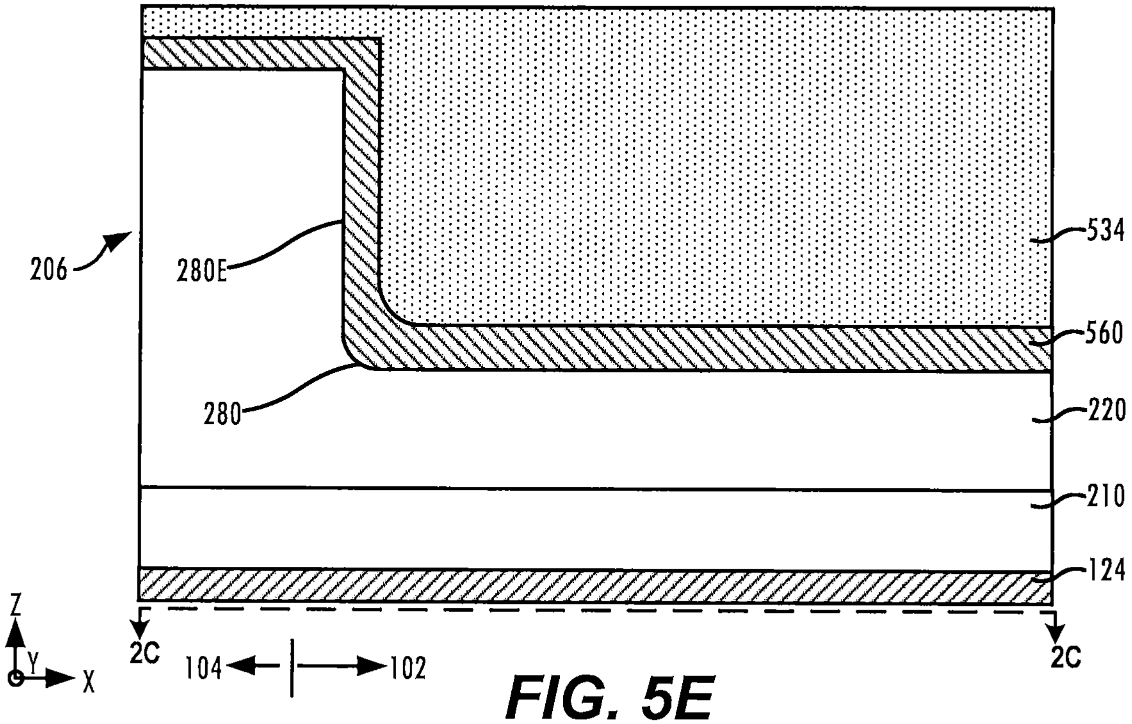
Figure 5F:
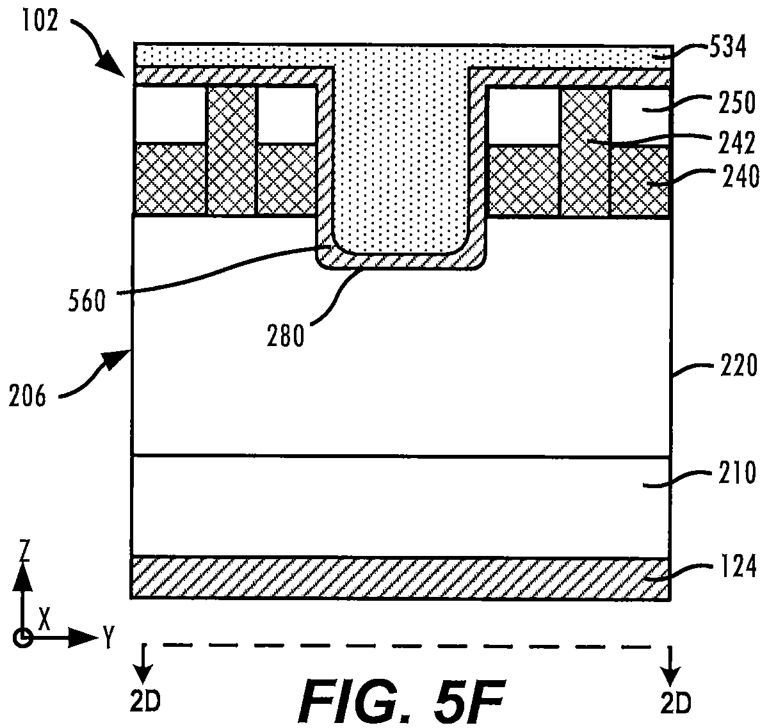

Referring to FIGS. 5E and 5F, an electrode layer 534 may be formed on the gate insulating material 560. The electrode layer 534 may also be formed within, and in some embodiments fill, the gate trench 280. The electrode layer 534 may include, for example, a silicide, doped polycrystalline silicon (poly-Si or poly), and/or a stable conductor.

Figure 5G:
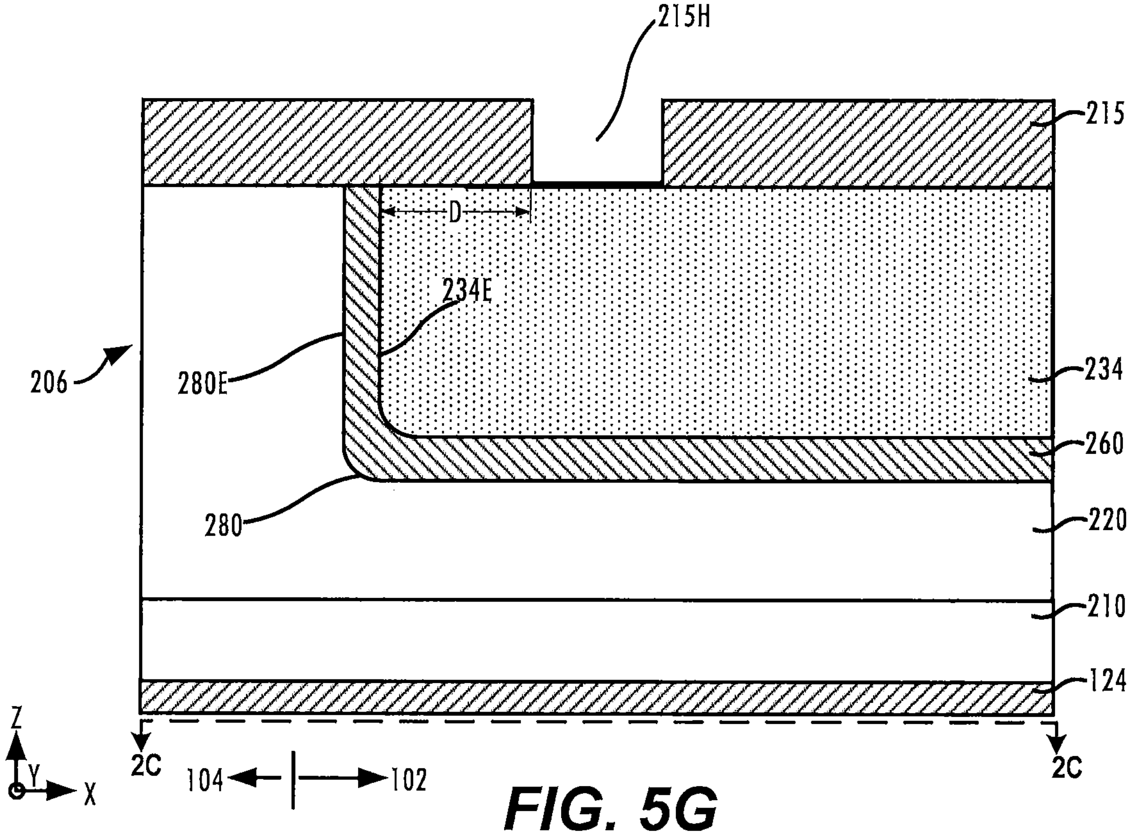
Figure 5H:
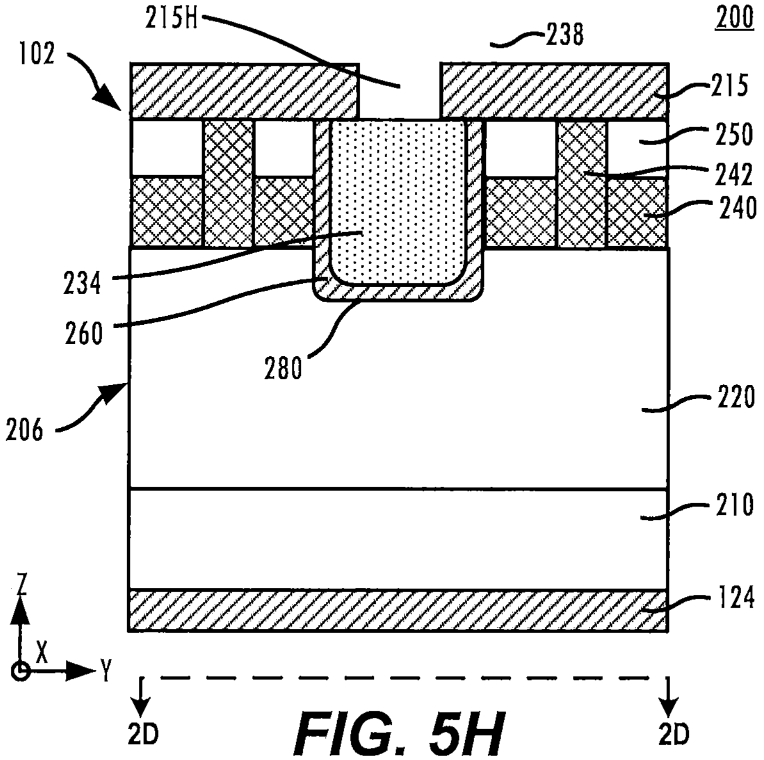

Referring to FIGS. 5G and 5H, the electrode layer 534 and the gate insulating material 560 may be patterned to remove the portions of the electrode layer 534 and the gate insulating material 560 that are on the upper surface of the semiconductor layer structure 206 so as to form the gate finger 234 and the gate insulating layer 260. In some embodiments, a top surface of the gate insulating layer 260 and the top surface of the gate finger 234 may be coplanar, but the embodiments of the present invention are not limited thereto.

A dielectric layer 215 may be deposited and patterned to form via holes 215H. The dielectric layer 215 may be an $SiO_2$ layer, $SiO_xN_y$, $Si_xN_y$, $Al_2O_3$ and/or high-K dielectrics such as hafnium oxide, hafnium silicate, $HfSi_xO_yN_z$, or mixtures of hafnium-silicon oxy-nitrides with other oxides such as $La_2O_3$. The via hole 215H may be positioned a distance D from an end 234E of the gate finger 234. In some embodiments, the via hole 215H may be formed in the active region 102. However, the embodiments of the present disclosure are not limited to such a configuration. In some embodiments, such as when manufacturing the embodiments of the present invention described with respect to FIGS. 3A to 3E, the via hole 215H may be formed in the inactive region 104 to be offset from an end 334E of a gate finger 334 that extends into the inactive region 104 (see, e.g., FIG. 3C).

Referring back to FIGS. 2A to 2D, the gate bus 236 and the gate connector 238 may be formed. For example, a layer of conductive material (e.g., a metal) may be formed on the dielectric layer 215 and within the via holes 215H. The layer of conductive material may be patterned to form the gate bus 236 and the gate connector 238. In some embodiments, the gate bus 236 and the gate connector 238 may be formed from a same layer, but the present invention is not limited thereto.

In some embodiments, such as when manufacturing the embodiments of the present invention described with respect to FIGS. 3A to 3E, the formation of the gate connectors 238 may not be necessary. For example, the layer of conductive material (e.g., a metal) may be formed on the dielectric layer 215 and within the via holes 215H that are in the inactive region 104 vertically overlapping the gate finger 334. The layer of conductive material may be patterned to form the gate bus 236 with connections (by way of the via 345) to the gate finger 334.

In order to address the disadvantages of some devices, embodiments described herein provide gate connectors and/or conductive vias that allow for an improvement to the reliability of the device in a simple manner. The gate connectors and/or conductive vias allow for a connection to the gate finger at a position that is offset from the end of the gate finger so as to avoid the creation of portions of the gate finger that can be susceptible to premature damage. The power switching devices according to embodiments disclosed herein may provide significantly improved reliability.

It will be appreciated that the specific layer structure, doping concentrations, materials, conductivity types and the like that are shown in the figures and/or described herein are merely provided as examples to illustrate in detail the structure of a specific example embodiment. Thus, the specific details discussed below are not limiting to the present invention.

While some of the preceding figures illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

Herein, embodiments of the present invention are described with respect to cross-sectional diagrams that show one or two unit cells of a power switching devices. It will be appreciated that actual implementations will typically include a much larger number of unit cells. However, it will also be appreciated that the present invention is not limited to such devices, and that the claims appended hereto also cover MOSFETs and other power switching devices that comprise, for example, a single unit cell. Moreover, while the present disclosure focuses on silicon carbide devices, it will be appreciated that embodiments of the present invention may also have applicability to devices formed using other wide band-gap semiconductors such as, for example, gallium nitride, zinc selenide or any other II-VI or III-V wide band-gap compound semiconductors.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device comprising:

a semiconductor layer structure;

a unit cell transistor comprising a gate finger, the gate finger longitudinally extending in a first direction in a gate trench between source regions in an active region of the semiconductor layer structure; and a gate bus comprising a plurality of first portions that protrude from a second portion, the second portion longitudinally extending along a periphery of the active region in a second direction crossing the first direction, wherein the first portions of the gate bus protrude in the first direction from a position between opposing ends of the second portion of the gate bus and protrude inward from the periphery into the active region, and wherein one of the first portions is electrically connected to the gate finger by a via that is within and spaced apart from the periphery of the active region.

2. The semiconductor device of claim 1, wherein the first material of the gate finger does not continuously extend from the gate trench onto a surface outside the gate trench.

3. The semiconductor device of claim 1, wherein the semiconductor device further comprises an inactive region, wherein the second portion is in the inactive region, and wherein the first portion of the gate bus extends toward the active region in the first direction from the second portion of the gate bus in the inactive region to vertically overlap the gate finger and the source regions in the active region.

4. The semiconductor device of claim 1, wherein the gate finger extends on a gate insulating layer in the gate trench, and wherein an uppermost surface of the gate finger is at or below an upper surface of the gate insulating layer.

5. The semiconductor device of claim 1, wherein the via is a first via on a first portion of the gate finger, and further comprising a gate runner extending in the second direction that crosses the first direction, wherein the gate runner vertically overlaps the gate finger and the source regions, and is electrically connected to the gate finger by a second via on a second portion of the gate finger that is different from the first portion.

6. The semiconductor device of claim 1, wherein an upper surface of the gate finger is planar.

7. The semiconductor device of claim 1, wherein the periphery of the active region is adjacent a termination portion of the semiconductor layer structure.

8. The semiconductor device of claim 1, wherein the active region comprises first and second portions, and the periphery of the active region is between the first and second portions of the active region.

9. The semiconductor device of claim 1, wherein the gate finger comprises a first material and the gate bus comprises a second material, and the first material is different from the second material.

10. A semiconductor device comprising:

a semiconductor layer structure comprising an active region and an inactive region;

a gate bus comprising a first portion in the inactive region and extending along a periphery of the active region, a second portion, and a plurality of third portions;

a plurality of gate fingers that longitudinally extend in a first direction in respective gate trenches that are between source regions in the active region and are below a surface of the semiconductor layer structure, wherein the gate fingers are electrically connected to the third portions of the gate bus by respective first vias that extend under the third portions and perpendicular to an upper surface of the semiconductor layer structure, wherein the third portions of the gate bus respectively protrude in the first direction from respective positions between opposing ends of the first portion and protrude inward from the periphery into the active region; and the second portion of the gate bus extends in a second direction that crosses the first direction, is within the periphery of the active region, and is electrically connected to the gate fingers by respective second vias on the gate fingers.

11. The semiconductor device of claim 10, further comprising a dielectric layer on the gate fingers, wherein the first vias extend through the dielectric layer.

12. The semiconductor device of claim 10, wherein the first vias are connected to the gate fingers at respective positions that are offset from respective ends of the gate fingers.

13. The semiconductor device of claim 10, wherein the third portions comprises a plurality of gate connectors extending in the first direction, wherein the gate connectors comprise an upper surface that is coplanar with an upper surface of the first portion of the gate bus, and wherein the gate connectors are electrically connected to the gate fingers by the first vias.

14. The semiconductor device of claim 10, wherein the first vias are on first portions of the gate fingers, and wherein the second portion of the gate bus comprises a gate runner that vertically overlaps the gate fingers and is electrically connected to the gate fingers by the second vias on second portions of the gate fingers that are different from the first portions of the gate fingers.

15. The semiconductor device of claim 10, wherein the periphery of the active region is adjacent a termination portion of the semiconductor layer structure.

16. The semiconductor device of claim 10, wherein the active region comprises first and second portions, and the periphery of the active region is between the first and second portions of the active region.

17. A semiconductor device comprising:

a semiconductor layer structure comprising an active region and an inactive region;

a gate bus in the inactive region, at least a portion of the gate bus extending along a periphery of the active region on at least two sides of the semiconductor device;

a gate trench in the semiconductor layer structure between source regions in the active region;

a gate insulating layer in the gate trench; and a gate finger on the gate insulating layer, wherein the gate finger is electrically connected to the gate bus by one or more vias on the gate finger within the periphery of the active region, and wherein the one or more vias on the gate finger vertically overlap the gate trench in the active region and are spaced apart from the periphery of the active region.

18. The semiconductor device of claim 17, wherein the gate finger comprises a first material, and wherein the one or more vias comprise a second material, different than the first material.

19. The semiconductor device of claim 18, wherein the one or more vias comprise one or more first vias, and further comprising a gate connector extending from the inactive region to the active region, wherein the gate connector is electrically connected to the gate bus and comprises an upper surface that is coplanar with an upper surface of the gate bus, and wherein the gate connector is electrically connected to the gate finger by a second via.

20. The semiconductor device of claim 17, wherein the gate finger is electrically connected to the gate bus by the one or more vias at respective positions that are offset from an end of the gate finger.

21. The semiconductor device of claim 17, wherein the gate bus is electrically connected to the gate finger by a first via on a first portion of the gate finger, and further comprising a gate runner extending on the semiconductor layer structure, wherein the gate runner vertically overlaps the gate finger and is electrically connected to the gate finger by a second via on a second portion of the gate finger that is different from the first portion.

22. The semiconductor device of claim 17, wherein an upper surface of the gate finger is planar.

23. A semiconductor device comprising:

a semiconductor layer structure comprising an active region and an inactive region;

a unit cell transistor comprising a gate finger, the gate finger comprising a first material longitudinally extending in a first direction in a gate trench that is between source regions in the active region and is below a surface of the semiconductor layer structure, wherein an upper surface of the gate finger in the gate trench is substantially planar and the first material does not extend beyond the upper surface, and wherein the gate finger comprises a first portion in the active region and a second portion in the inactive region; and a gate bus in the inactive region that extends along a periphery of the active region and is electrically connected to the gate finger by a via that is within the periphery of the active region, wherein the via vertically extends between the gate bus and the upper surface of the gate finger.

24. The semiconductor device of claim 23, wherein a width of the first portion in the gate trench is smaller than a width of the second portion in the gate trench along a direction perpendicular to the first direction in which the second portion longitudinally extends.

25. The semiconductor device of claim 23, wherein the gate bus comprises a gate connector portion that vertically overlaps the gate finger and is electrically connected to the gate finger by the via.

26. The semiconductor device of claim 23, wherein the via is a first via, and further comprising a gate runner that extends in a second direction that crosses the first direction, and is electrically connected to the gate finger by a second via on the gate finger in the active region.

27. The semiconductor device of claim 23, wherein the periphery of the active region is adjacent a termination portion of the semiconductor layer structure.

28. The semiconductor device of claim 23, wherein the active region comprises first and second portions, and the periphery of the active region is between the first and second portions of the active region.

29. The semiconductor device of claim 23, wherein the via comprises a second material that is different from the first material of the gate finger.

* * * * *